(12) United States Patent  
Briggs

(10) Patent No.: US 9,086,992 B1
(45) Date of Patent: Jul. 21, 2015

(54) SYSTEM AND METHOD FOR INTERCONNECTING STORAGE ELEMENTS

(71) Applicant: DIGITAL ORDNANCE STORAGE, INC., Spring, TX (US)

(72) Inventor: Steve Briggs, Spring, TX (US)

(73) Assignee: DIGITAL ORDNANCE STORAGE, INC., Spring, TX (US)

( * ) Notice: Subject to any disclaimer, the term of this patent is extended or adjusted under 35 U.S.C. 154(b) by 116 days.

(21) Appl. No.: 13/914,530

(22) Filed: Jun. 10, 2013

Related U.S. Application Data

(60) Provisional application No. 61/657,547, filed on Jun. 8, 2012.

(51) Int. Cl.
*H03M 13/00* (2006.01)
*G06F 11/10* (2006.01)

(52) U.S. Cl.
CPC .................................. *G06F 11/1076* (2013.01)

(58) Field of Classification Search
CPC .................................................... H03M 13/151
USPC .......... 714/785, 761, 758, 755, 762, 765, 749
See application file for complete search history.

(56) References Cited

U.S. PATENT DOCUMENTS

| | | | |
|---|---|---|---|
| 3,851,306 A | 11/1974 | Patel | |
| 3,868,632 A * | 2/1975 | Hong et al. | 714/755 |
| 3,982,226 A | 9/1976 | Bunker et al. | |
| 4,052,698 A | 10/1977 | Ragle | |
| 4,416,010 A | 11/1983 | Hibino et al. | |
| 4,893,312 A | 1/1990 | Cogley, Jr. | |
| 5,218,689 A | 6/1993 | Hotle | |
| 5,241,546 A * | 8/1993 | Peterson et al. | 714/761 |
| 5,634,033 A | 5/1997 | Stewart et al. | |
| 6,237,052 B1 | 5/2001 | Stolowitz | |
| 6,526,477 B1 | 2/2003 | Yuan et al. | |
| 7,010,625 B2 | 3/2006 | Wang et al. | |
| 7,085,859 B2 | 8/2006 | Chen et al. | |
| 7,840,878 B1 | 11/2010 | Tang et al. | |
| 8,370,715 B2 | 2/2013 | Hafner et al. | |
| 2010/0199123 A1 | 8/2010 | Cohen | |
| 2012/0271961 A1 | 10/2012 | Alshinnawi et al. | |

FOREIGN PATENT DOCUMENTS

EP         1156419 A2    11/2001

* cited by examiner

*Primary Examiner* — Fritz Alphonse
(74) *Attorney, Agent, or Firm* — Winstead PC

(57) ABSTRACT

In one embodiment, a method includes receiving data. The method further includes splitting the data into a plurality of fixed-size blocks. Each block comprises a plurality of bytes. In addition, the method includes, for each block of the plurality of fixed-size blocks, calculating an error-correction byte. The method also includes appending the error-correction byte to the block as one of the plurality of bytes. Moreover, the method includes calculating, as part of the block, a parity bit for each of the plurality of bytes. Furthermore, the method includes separating the block into a plurality of bit streams that are perpendicular to the plurality of bytes. Each bit position of the block corresponds to one of the plurality of bit streams. Also, the method includes causing the plurality of bit streams to be stored on a plurality of storage elements in a bit-striped fashion.

21 Claims, 30 Drawing Sheets

SYSTEM AND METHOD FOR INTERCONNECTING STORAGE ELEMENTS

CROSS-REFERENCE TO RELATED APPLICATIONS

This patent application claims priority from, and incorporates by reference the entire disclosure of, U.S. Provisional Patent Application No. 61/657,547 filed on Jun. 8, 2012.

BACKGROUND

1. Technical Field

The present invention relates generally to digital data processing and more particularly, but not by way of limitation, to systems and methods for interconnecting storage elements.

2. History of Related Art

Current supercomputing applications access and generate enormous quantities of data but are increasingly bandwidth limited when performing time-sensitive operations such as check pointing. Check pointing refers to the storage of a state of an entire system including, for example, memories, registers, register flags, access records, and cache contents, in such a fashion, that, should an operation fail in the future for some indeterminate reason, the operation may be restarted from a check point rather than restarting from the beginning. In general, the shorter the time required to fully store the state of the system, the quicker the operation may continue. Therefore, for a supercomputer cluster with hundreds of terabytes of data in memory, transfer times become critical.

The industry has developed a number of storage-interface technologies for storage elements such as disk drives; however, such technologies do not typically scale well in bandwidth. For example, Fibre Channel provides a dedicated storage interface with a network bandwidth of eight gigabits per second. Some storage elements have Fibre Channel interconnects so that they can be directly attached to a Fibre Channel switch. These interconnects may be bridged to increase bandwidth to the storage elements. However, Fibre Channel is limited in a number of lanes that can be bridged together. In addition, a single drive cannot generally be bridged.

SUMMARY OF THE INVENTION

In one embodiment, a method includes receiving data. The method further includes splitting the data into a plurality of fixed-size blocks. Each block comprises a plurality of bytes. In addition, the method includes, for each block of the plurality of fixed-size blocks, calculating an error-correction byte. The method also includes appending the error-correction byte to the block as one of the plurality of bytes. Moreover, the method includes calculating, as part of the block, a parity bit for each of the plurality of bytes. Furthermore, the method includes separating the block into a plurality of bit streams that are perpendicular to the plurality of bytes. Each bit position of the block corresponds to one of the plurality of bit streams. Also, the method includes causing the plurality of bit streams to be stored on a plurality of storage elements in a bit-striped fashion.

In one embodiment, a system includes an error-correction module and a plurality of transmission buffers. The error-correction module includes circuitry operable to receive data and split the data into a plurality of fixed-size blocks. Each block includes a plurality of bytes. The error-correction module further includes circuitry operable, for each block of the plurality of fixed-size blocks, to calculate an error-correction byte. In addition, the error-correction module includes circuitry operable to append the error-correction byte to the block as one of the plurality of bytes. Also, the error-correction module includes circuitry operable to calculate, as part of the block, a parity bit for each of the plurality of bytes. Moreover, the error-correction module includes circuitry operable to separate the block into a plurality of bit streams that are perpendicular to the plurality of bytes, each bit position of the block corresponding to one of the plurality of bit streams. The plurality of transmission buffers includes circuitry operable to transmit the plurality of bit streams in parallel to a storage interface controller for storage on a plurality of storage elements in a bit-striped fashion.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF ILLUSTRATIVE EMBODIMENTS OF THE INVENTION

In various embodiments, data security and reliability can be ensured in a scalable fashion via a bit-striping and error-correction scheme described herein. In a typical embodiment, whenever data is to be stored, the data can be separated into blocks of a fixed number of bytes such that one of the bytes is a generated error code. Thereafter, each block can be striped perpendicularly to the bytes so that each bit position, aggregated across the bytes, can be considered a bit stream. Each bit stream can be written onto a different storage element within a storage unit such as, for example, a Redundant Array of Independent Disks (RAID) storage system. As described in greater detail below, a nature of the error code permits bit streams to be reconstructed immediately in the event of malfunctions such as, for example, transmission errors or storage-element failures. In addition, the bit striping provides for data security in transit, in storage, and on read. For purposes of this patent application, a storage element is a virtual or physical unit of memory on which data can be stored. A storage unit, as used herein, comprises one or more storage elements.

Figure 1:
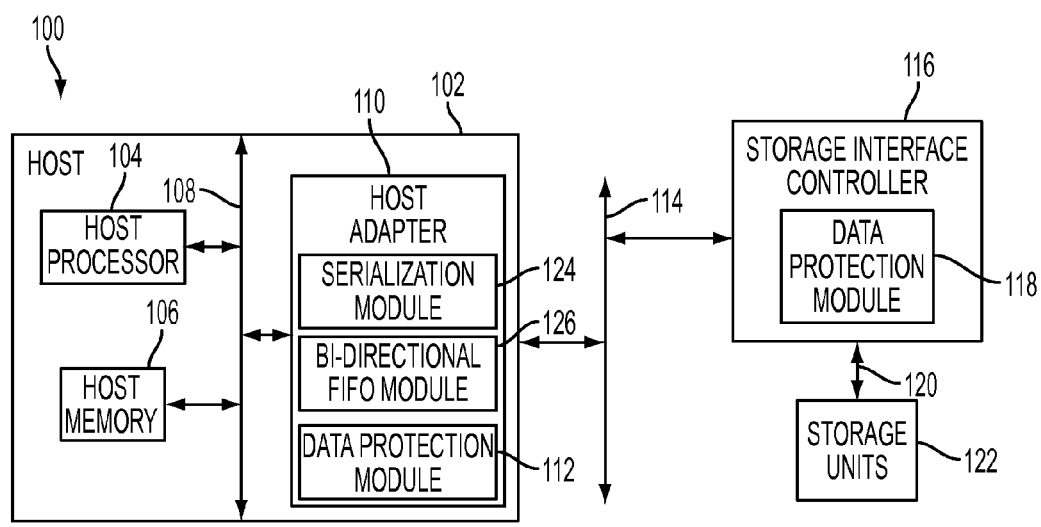
FIG. 1 illustrates a system for providing efficient, secure, and reliable storage of large quantities of data.

FIG. 1 illustrates a system 100 for providing efficient, secure, and reliable storage of large quantities of data such as, for example, data on the order of many terabytes per file. The system 100 includes a host 102, a storage interface controller 116, and storage units 122. In a typical embodiment, the host 102 can be a node in computer cluster such as, for example, a cluster embodying a supercomputer. In these embodiments, the host 102, potentially in combination with numerous other nodes, may be executing all or part of a supercomputing application that requires performance of one or more complex computer operations.

The host 102 includes at least one host processor 104, a host memory 106, and a host adapter 110. The host memory 106 can include any combination of volatile and non-volatile memory of the host 102. For example, the host memory 106 can include registers, register flags, access records, cache contents, and/or any other data stored in Random Access Memory (RAM), disk storage, or other memory utilized by the host.

The host adapter 110 includes a serialization module 124, a bidirectional first-in first-out (FIFO) module 126, and a data-protection module 112. The host adapter 110 is operable to communicate with the at least one host processor 104 and the host memory 106 via a communication link 108. In various embodiments in which the host adapter 110 is implemented by hardware, the communication link 108 may be a physical connection via, for example, a Peripheral Component Interconnect Express (PCIe) interface of the host 102. In software implementations, the communication link 108 is illustrative of a logical communication link to an executing software application. The serialization module 124 is operable to de-serialize data inbound to the host adapter 110 and to serialize data outbound to the host memory 106. The bidirectional FIFO module 126 routes data between the serialization module 124 and the data-protection module in a FIFO fashion. The data-protection module 112 is operable to block-encode the data and generate error-correction codes. The data-protection module 112 is also operable to perform instantaneous error correction to data streaming therethrough. Exemplary operation of the data-protection module 112 will be described in greater detail with respect to the ensuing FIGURES.

The storage interface controller 116 includes a data-protection module 118 that operates similarly to the data-protection module 112. Therefore, in various embodiments, error correction can occur each time data is subjected to risk (e.g., on both ends of a transmission between the host 102 and the storage interface controller 116, on read from the storage elements 122, etc.) The storage interface controller 116 is typically operable to receive and store data on one or more of the storage units 122 in a bit-striped fashion. The data may be received via the communication link 114 from the host 102 and/or from numerous other hosts that operate similarly to the host 102. Each of the storage units 122 may be, for example, a RAID storage system (e.g., RAID 0, RAID 6, or RAID 60) controllable by the storage interface controller 116. In this fashion, each of the storage units 122 generally comprises a plurality of storage elements. In certain embodiments, advantages can be realized when each of the storage units 122 includes a RAID array of nine to eleven storage elements.

In various embodiments, the communication link 114 is representative of 10-gigabit Ethernet ("10GigE") and associated networking hardware such as switches, routers, and/or the like. In these embodiments, the communication link 114 can further include optical fiber (e.g., single-mode or multi-mode) that spans a physical distance between the host 102 and the storage interface controller 116, including any intervening networking hardware. In certain embodiments, the physical distance between the host 102 and the storage interface controller 116 is less than one-hundred meters. However, in various other embodiments, optical fiber may be utilized to run much longer distances if greater remoteness of the storage interface controller 116 is desirable or necessary. It should be appreciated that, although 10GigE is presented as an example of technology that the communication link 114 can utilize, the communication link 114 is not constrained to 10GigE. Numerous other communications technologies can also be utilized for the communication link 114 including, but not limited to, InfiniBand, Fibre Channel, and/or traditional networking technologies.

Each of the various illustrated modules or components above may be implemented, for example, as software and/or application-specific circuitry (e.g., ASICs or FPGAs). Where the computing system includes multiple computing devices, these devices may, but need not be, co-located. The results of the disclosed methods and tasks may be persistently stored by transforming physical storage devices, such as solid state memory chips and/or magnetic disks, into a different state. Each service described, such as those shown in FIGS. 3-4 and 6-9, may be implemented by one or more computing devices, such as one or more physical servers programmed with associated server code.

Below, examples of error-correction mathematics will be presented (including with respect to FIG. 2). It should be appreciated that the mathematics is exemplary and is not intended to be exhaustive. For background information and further examples of using error-correction mathematics, U.S. Pat. No. 4,052,698 to Ragle is hereby incorporated by reference. Following the examples of error-correction mathematics, an example of error encoding utilizing the system 100 will be described with respect to FIG. 3. An example of an error-correction process will be described with respect to FIG. 4. An example of a data-protection module will be described with respect to FIG. 5. Examples of error correction for specific correctable scenarios will be described with respect to FIGS. 6-9. FIGS. 10A-24B illustrate exemplary error-correction circuitry.

An Example of Mathematics for an Error-Correction Code

All examples of error-correction mathematics described herein utilize Galois Field (GF) algebra and, more particularly, GF ($2^8$). Therefore, bitwise modulo-two arithmetic is performed whenever reference is made to the mathematical operations of addition, subtraction, multiplication, and division. Various embodiments described herein calculate an error-correction code prior to data being subjected to a risk of error via, for example, transmission, storage, etc. The error-correction code enables certain types of error correction. An example of how to calculate the error-correction code will now be described. Equation 1 below illustrates an error-correction polynomial g(x). Therefore, the error-correction polynomial g(x) may be considered to be "100111001."

$$g(x)=x^8+x^5+x^4+x^3+x^0 \qquad \text{Equation 1}$$

The error-correction code is typically generated with respect to a block of eight bytes such that the first seven bytes are the data that is being subjected to the risk of error (referred to herein as the original data) and the eighth byte is the error-correction code. Therefore, each byte may be viewed as a coefficient in a generating polynomial shown in Equation 2 below.

$$f(x)=a_7x^7+a_6x^6+a_5x^5+a_4x^4+a_3x^3+a_2x^2+a_1x^1+a_0x^0=0 \qquad \text{Equation 2}$$

Stated differently, $a_0$ through $a_6$ may be considered to represent bytes 0 through 6 (i.e., the original data) and $a_7$ may be considered to represent the error-correction code. Equation 2 is the equivalent of shifting each byte to the left a number of bit positions equal to its exponent. That is, an exponent of '0' means no shift, an exponent of '1' means a 1-bit shift, an exponent of '2' means a 2-bit shift, etc. Table 1 below illustrates the bit shift for exemplary bytes $a_0$ through $a_6$ of all ones.

TABLE 1

| | | | | | | | | | |
|---|---|---|---|---|---|---|---|---|---|
| $a_0$ | | | | | 1 | 1 | 1 | 1 | 1 1 1 1 |
| $a_1$ | | | | 1 | 1 | 1 | 1 | 1 | 1 1 1 |
| $a_2$ | | | 1 | 1 | 1 | 1 | 1 | 1 | 1 1 |
| $a_3$ | | 1 | 1 | 1 | 1 | 1 | 1 | 1 | 1 |
| $a_4$ | 1 | 1 | 1 | 1 | 1 | 1 | 1 | 1 | |
| $a_5$ | 1 | 1 | 1 | 1 | 1 | 1 | 1 | | |
| $a_6$ | 1 | 1 | 1 | 1 | 1 | 1 | 1 | | |

A formula for calculating the error-correction code ($a_7$) is represented in Equation 3 below.

$$a_7 = (a_6 x^6 + a_5 x^5 + a_4 x^4 + a_3 x^3 + a_2 x^2 + a_1 x^1 + a_0 x^0) \text{modulo} \, g(x) = 0 \quad \text{Equation 3}$$

Therefore, according to Equation 3, a modulo-two sum of the original data ($a_0$ through $a_6$) is computed. Table 2 illustrates an example of computing the modulo-two sum of the original data when the original data includes all ones.

TABLE 2

| | | | | | | | | | | | | |
|---|---|---|---|---|---|---|---|---|---|---|---|---|
| $a_0$ | | | | | | | 1 | 1 | 1 | 1 | 1 | 1 1 1 |
| $a_1$ | | | | | | 1 | 1 | 1 | 1 | 1 | 1 | 1 1 |
| $a_2$ | | | | | 1 | 1 | 1 | 1 | 1 | 1 | 1 | 1 |
| $a_3$ | | | | 1 | 1 | 1 | 1 | 1 | 1 | 1 | 1 | |
| $a_4$ | | | 1 | 1 | 1 | 1 | 1 | 1 | 1 | 1 | | |
| $a_5$ | | 1 | 1 | 1 | 1 | 1 | 1 | 1 | 1 | | | |
| $a_6$ | 1 | 1 | 1 | 1 | 1 | 1 | 1 | 1 | | | | |
| SUM | 1 | 0 | 1 | 0 | 1 | 0 | 1 | 1 | 0 | 1 | 0 | 1 |

Thereafter, that modulo-two sum is divided by the error-correction polynomial g(x) (Equation 1) to produce a remainder. The remainder is the error-correction code ($a_7$). It should be appreciated that the division can be performed as a sequence of subtraction operations without carry (i.e., bitwise XOR). In various embodiments, the division indicated by Equation 3 can be performed by feeding f(x) to a linear feedback shift register (LFSR) that has been configured with g(x) as divisor. In this manner, repeated cycles of the LFSR yield the error-correction code. As described in greater detail below with respect to FIG. 5, the division indicated by Equation 3 can also be pre-computed and stored in a lookup table.

Based on the error-correction code, a fixed-size block can be created that that has 8 bytes such that the first 7 bytes (bytes 0 through 6) are the original data and the eighth byte (byte 7) is the error-correction code. In addition, an odd parity can be calculated for each byte of the block (bytes 0 through 7). The block can take the format shown below in Table 3 below. Bytes 0 through 7 correspond to $a^0$ through $a^7$ as described above. Each 'b' indicates a respective binary value (i.e., 0 or 1). Each bit position (bit 0 through parity P) may be referred to herein as a bit stream.

TABLE 3

| | Bit 0 | Bit 1 | Bit 2 | Bit 3 | Bit 4 | Bit 5 | Bit 6 | Bit 7 | Parity (P) |
|---|---|---|---|---|---|---|---|---|---|
| Byte 0 | b | B | b | b | b | b | b | b | b |
| Byte 1 | b | b | b | b | b | b | b | b | b |
| Byte 2 | b | b | b | b | b | b | b | b | b |
| Byte 3 | b | b | b | b | b | b | b | b | b |
| Byte 4 | b | b | b | b | b | b | b | b | b |
| Byte 5 | b | b | b | b | b | b | b | b | b |
| Byte 6 | b | b | b | b | b | b | b | b | b |
| Byte 7 (E) | b | b | b | b | b | b | b | b | b |

An Example of Error-Correction Mathematics Using an Error-Correction Code

At any given point, error correction can occur based on the error-correction code and the block described above. For example, the block may be subjected to risk by transmission, storage, read, etc. In particular, after the block has been subjected to risk, an error pattern (EP) can be calculated as shown in Equation 4 below. In various embodiments, the division indicated by Equation 4 can be performed by feeding f(x) to a linear feedback shift register that has been configured with g(x) as divisor. In some embodiments, as described in greater detail below with respect to FIG. 5, all possible error patterns may be pre-computed and stored in a lookup table for easy access. An error can typically be detected when EP is non-zero. An EP of zero typically indicates that no error has occurred.

$$EP = \frac{f(x)}{g(x)} \quad \text{Equation 4}$$

Figure 2:
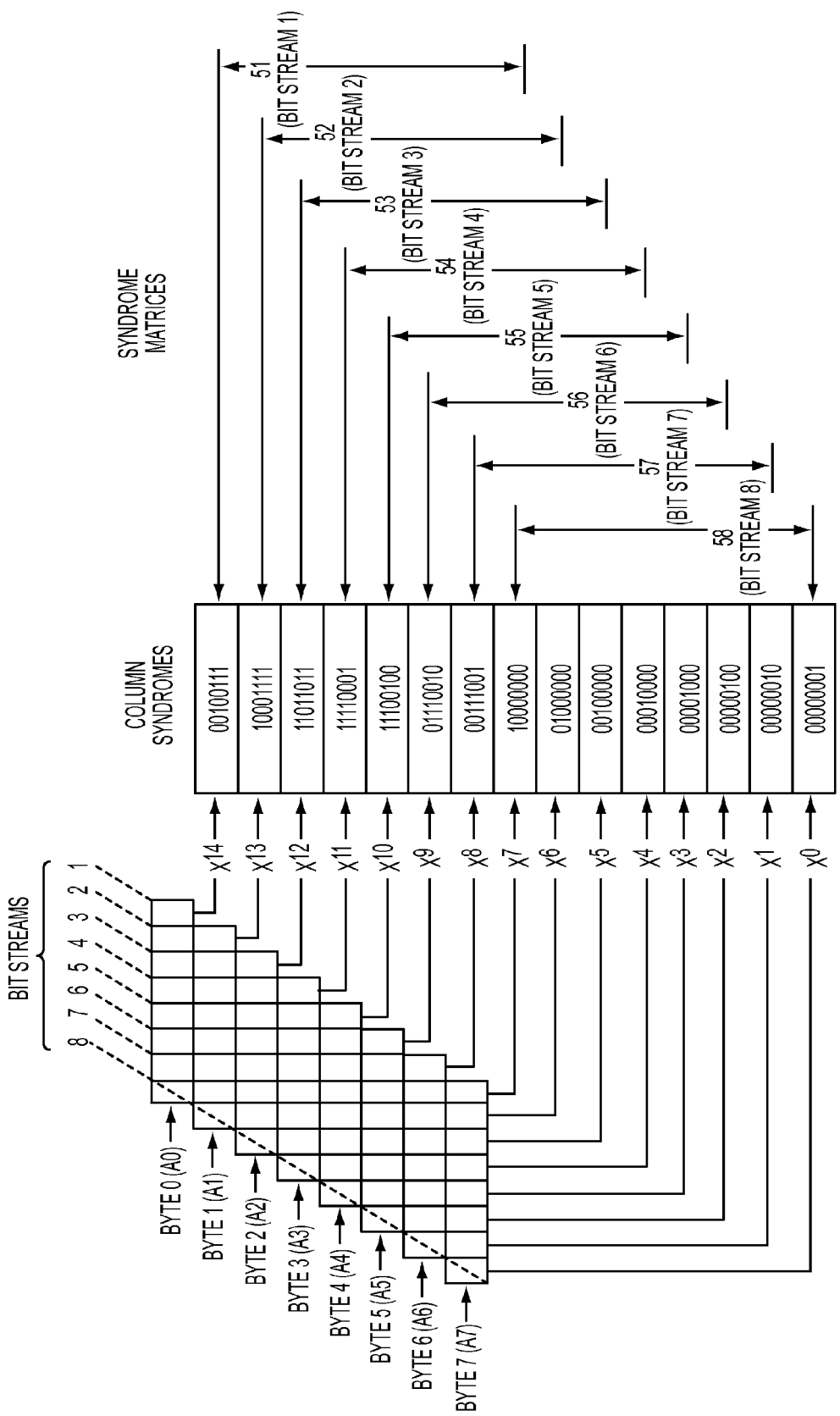
FIG. 2 illustrates various principles of error correction.

FIG. 2 illustrates various principles of error correction in greater detail. If errors occur when the block is subjected to risk, the EP should be non-zero. Conversely, if no errors occur when the block is subjected to risk, the EP should generally be zero. In FIG. 2, it can be seen that 64 single-bit errors are possible relative to an 8×8 matrix of a0 through a7. All single-bit errors in a column produce a same EP (i.e., syndrome) that is different from the syndromes of all other columns. That is, as shown, there are fifteen unique syndromes.

It is apparent that the syndromes, designated $X^n$, are associated in sets of eight with the eight bit streams. The sets, or matrices, are labeled 𝕊 1 through 𝕊 8. Thus, for example, bit stream 8, transversed by a diagonal line in the figure, for single bit errors, is characterized by the eight syndromes $X^0$ through $X^7$, and this set is unique to bit stream 8. It follows that pattern EP(X) for bit stream X corresponds to the syndromes of the syndrome set for the bits in error added modulo 2. For single bit stream errors, a parity computation (Vector P, comprising bits P of Table 6) indicates an error-correction vector E(X). In a typical embodiment, P represents a local parity computation (i.e., after transmission or other risk). Mathematically, these relationships may be expressed as shown in Equation 5 and Equation 6 below.

$$EP(X) = E(X) * \mathbb{S}(X) \quad \text{Equation 5}$$

$$EP(X) = P * \mathbb{S}(X) \quad \text{Equation 6}$$

For two bit-streams-in-error (stream X and stream Y), a combined EP (X, Y) is expressed as Equation 7 below.

$$EP(X, Y) = E(X) + E(Y) \quad \text{Equation 7}$$

Error-correction vectors E(X) and E(Y) for bit streams X and Y, respectively, may be expressed relative to the parity vector P as shown in Equation 8 below.

$$P = E(X) + E(Y) \quad \text{Equation 8}$$

Further manipulated, E(X) may be expressed as Equation 9 below.

$$E(X) = [P + (EP(X,Y) * \mathbb{S}(Y))] * [\mathbb{I} + (\mathbb{S}(X) * \mathbb{S}(Y))]^{-1} \quad \text{Equation 9}$$

For purposes of simplification, 𝕄 (X, Y) may be introduced to represent a portion of Equation 9 as shown in Equation 10, where 𝕀 is the identity matrix. Therefore, it should be appreciated that 𝕄 (X, Y) is a function of a bit-stream difference between X and Y (i.e., a difference between Y's bit position and X's bit position).

$$\mathbb{M}(X,Y) = [\mathbb{M} + (\mathbb{S}(X) * \mathbb{S}(Y))]^{-1} \quad \text{Equation 10}$$

Therefore, based on Equation 10, Equation 9 may be simplified as shown in Equation 11 below.

$$E(X)=[P+(EP(X,Y)*\mathbb{S}(Y))]*\mathbb{M}(X,Y) \quad \text{Equation 11}$$

A matrix $\mathbb{K}2$ may be introduced as shown in Equation 12 below.

$$\mathbb{K}2=\mathbb{M}(X,Y) \quad \text{Equation 12}$$

A matrix $\mathbb{K}3$ may be introduced as shown in Equation 13 below.

$$\mathbb{K}3=\mathbb{S}(Y)*\mathbb{M}(X,Y) \quad \text{Equation 13}$$

Therefore, based on the above equations, Equation 11 may be reduced as Equation 14 below.

$$E(X)=[P*\mathbb{K}2]+[EP(X,Y)*\mathbb{K}3] \quad \text{Equation 14}$$

In similar fashion, Equation 15 expresses an equation for the error-correction vector E(Y).

$$E(Y)=P+E(X) \quad \text{Equation 15}$$

An Example of an Error-Correction Encoding Process

Figure 3:
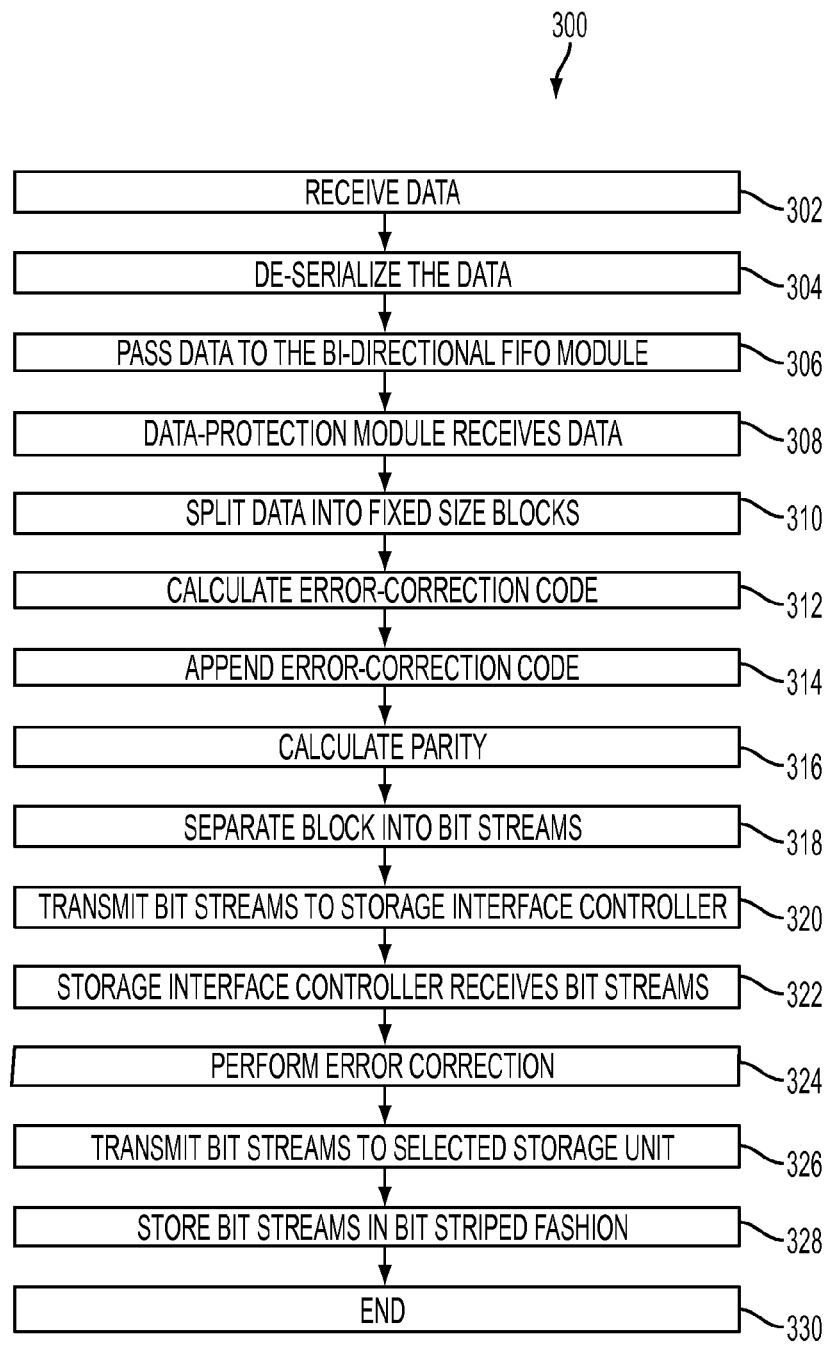
FIG. 3 illustrates a process for storing data.

FIG. 3 illustrates a process 300 for storing data utilizing a system such as, for example, the system 100 of FIG. 1. For illustrative purposes, the process 300 will be described relative to the system 100 of FIG. 1. The process 300 begins at step 302. At step 302, the host adapter 110 receives data via the communication link 108. From step 302, the process 300 proceeds to step 304. At step 304, the serialization module 124 de-serializes the data. In some embodiments, step 304 may be optional. For example, if the data is received in a de-serialized format, then step 304 may be omitted. From step 304, the process 300 proceeds to step 306. At step 306, the serialization module 124 passes the data to the bi-directional FIFO module 126 so that all data maintained thereby can be processed in a FIFO fashion. From step 306, the process 300 proceeds to step 308.

At step 308, the data-protection module 112 receives the data from the bi-directional FIFO module 126. From step 308, the process 300 proceeds to step 310. At step 310, the data-protection module 112 splits the data into fixed-size blocks. In a typical embodiment, the fixed-size blocks are each initially seven bytes in length. Table 4 below illustrates an exemplary format of a block following step 310. As shown, the block includes 7 bytes, each byte including eight bits. Each 'b' is indicative of a '1' or '0' binary value. From step 310, the process 300 proceeds to step 312.

TABLE 4

|        | Bit 0 | Bit 1 | Bit 2 | Bit 3 | Bit 4 | Bit 5 | Bit 6 | Bit 7 |
|--------|-------|-------|-------|-------|-------|-------|-------|-------|
| Byte 0 | b     | B     | b     | b     | b     | b     | b     | b     |
| Byte 1 | b     | b     | b     | b     | b     | b     | b     | b     |
| Byte 2 | b     | b     | b     | b     | b     | b     | b     | b     |
| Byte 3 | b     | b     | b     | b     | b     | b     | b     | b     |
| Byte 4 | b     | b     | b     | b     | b     | b     | b     | b     |
| Byte 5 | b     | b     | b     | b     | b     | b     | b     | b     |
| Byte 6 | b     | b     | b     | b     | b     | b     | b     | b     |

At step 312, for each block, the data-protection module 112 calculates an error-correction code for the block. For example, the error-correction code may be calculated according to Equation 3 above. In a typical embodiment, the error-correction code is eight bits in length. From step 312, the process 300 proceeds to step 314. At step 314, for each block, the data-protection module 112 appends the error-correction code (E) as an eighth byte of the block. Table 5 below illustrates an exemplary format of a block following step 314. As shown, the block includes eight bytes, each byte including eight bits. Bytes zero through six represent the original data.

The eighth byte is the error-correction code (E) generated by the data-protection module 112. Each 'b' indicates a binary value of '1' or '0'. From step 314, the process 300 proceeds to step 316.

TABLE 5

|        | Bit 0 | Bit 1 | Bit 2 | Bit 3 | Bit 4 | Bit 5 | Bit 6 | Bit 7 |
|--------|-------|-------|-------|-------|-------|-------|-------|-------|
| Byte 0 | b     | B     | b     | b     | b     | b     | b     | b     |
| Byte 1 | b     | b     | b     | b     | b     | b     | b     | b     |
| Byte 2 | b     | b     | b     | b     | b     | b     | b     | b     |
| Byte 3 | b     | b     | b     | b     | b     | b     | b     | b     |
| Byte 4 | b     | b     | b     | b     | b     | b     | b     | b     |
| Byte 5 | b     | b     | b     | b     | b     | b     | b     | b     |
| Byte 6 | b     | b     | b     | b     | b     | b     | b     | b     |
| E      | b     | b     | b     | b     | b     | b     | b     | b     |

At step 316, for each block, the data-protection module 112 calculates parity for each byte of the block. In a typical embodiment, the data-protection module 112 calculates odd parity and thereby produces a parity bit for each byte. Table 6 below illustrates an exemplary format of a block following step 316. As shown, the block includes eight bytes, each byte including eight bits, plus a parity bit for each byte. As before, bytes zero through six represent the original data while the eighth byte is the error-correction code (E). Each 'b' indicates a binary value of '1' or '0'. From step 316, the process 300 proceeds to step 318.

TABLE 6

|        | Bit 0 | Bit 1 | Bit 2 | Bit 3 | Bit 4 | Bit 5 | Bit 6 | Bit 7 | Parity Bit |
|--------|-------|-------|-------|-------|-------|-------|-------|-------|------------|
| Byte 0 | b     | B     | b     | b     | b     | b     | b     | b     | b          |
| Byte 1 | b     | b     | b     | b     | b     | b     | b     | b     | b          |
| Byte 2 | b     | b     | b     | b     | b     | b     | b     | b     | b          |
| Byte 3 | b     | b     | b     | b     | b     | b     | b     | b     | b          |
| Byte 4 | b     | b     | b     | b     | b     | b     | b     | b     | b          |
| Byte 5 | b     | b     | b     | b     | b     | b     | b     | b     | b          |
| Byte 6 | b     | b     | b     | b     | b     | b     | b     | b     | b          |
| (E)    | b     | b     | b     | b     | b     | b     | b     | b     | b          |

At step 318, for each block, the data-protection module 112 separates the block into bit streams. In a typical embodiment, the bit streams are perpendicular to the bytes so that each bit position (i.e., bits 0-7 and parity bit) corresponds to a bit stream. In this manner, each bit position, aggregated across all bytes of the block, may be considered a distinct bit stream. According to the examples described above, nine bit streams are created (i.e. one bit stream for each column of Table 6). From step 318, the process 300 proceeds to step 320.

At step 320, for each block, the data-protection module 112 transmits the bit streams to the storage interface controller 116. From step 320, the process 300 proceeds to step 322. At step 322, for each block, the storage interface controller 116 receives the bit streams. From step 322, the process 300 proceeds to step 324. At step 324, for each block, the data-protection module 118 checks the integrity of the block by performing error correction. Error correction typically encompasses identifying and correcting errors in one or two bit streams of the block. An example of how step 324 may be performed will be described in greater detail with respect to FIGS. 4 and 6-9. In some embodiments, if uncorrectable errors are found at step 324 (e.g., errors in three or more bit streams), the process 300 may terminate without writing any data to the storage units 122. From step 324, the process 300 proceeds to step 326.

At step 326, for each block, the data-protection module 118 transmits the bit streams over a communication link 120, to a selected storage unit of the storage units 122, for storage in a bit-striped fashion. That is, each bit stream is typically to be stored on a separate storage element of the selected storage unit. The communication link 120 may include, for example, Serial Attached SCSI (SAS) connections, Serial ATA (SATA) connections, and/or the like. As noted above with respect to FIG. 1, the storage units 122 may be, for example, RAID storage systems having nine or more storage elements. The RAID storage systems may implement, for example, RAID 0. In such RAID 0 embodiments, each bit stream can be stored as a RAID 0 "block" on separate storage elements of the selected storage unit, thus achieving bit striping using a RAID 0 storage system. Bit striping in this fashion results in increased security because at least seven separate storage units must be synchronously accessed for regeneration of the data block.

In addition, the bit striping efficiently adds redundancy and fault tolerance that are not characteristically present using, for example, RAID 0. Because only one bit stream is stored per storage element of the selected storage unit, failures of as many as two storage elements are not fatal. Rather, error correction as described with respect to FIGS. 4 and 6-9 can be performed to derive lost bit streams and/or bit streams containing errors and thereby rapidly rebuild a RAID array embodied by the selected storage system without creating downtime. From step 326, the process 300 proceeds to step 328. At step 328, the selected storage unit of the storage units 122 stores the bit streams in the bit-striped fashion described above. From step 328, the process 300 proceeds to step 330. At step 330, the process 300 ends.

An Example of an Error Correction Process

Figure 4:
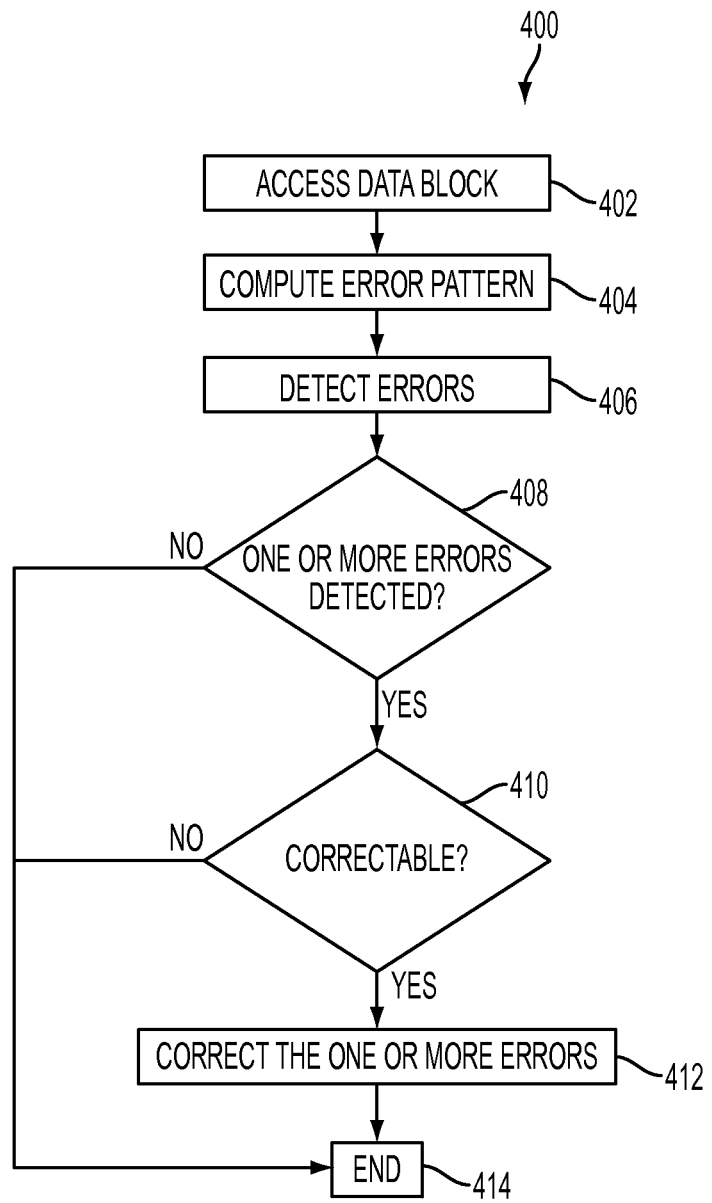
FIG. 4 illustrates a process for performing error correction.

FIG. 4 illustrates a process 400 for performing error correction. For illustrative purposes, the process 400 will be described relative to the system 100 of FIG. 1. The process 400 begins at step 402. At step 402, a data block is accessed. In a typical embodiment, the data block has the form shown in Table 6 above. In various embodiments, the data block has been subjected to risk, for example, by having been transmitted, stored, or read. From step 402, the process 400 proceeds to step 404. At step 404, an error pattern is computed. The error pattern can be computed based on, for example, Equation 4 above. From step 404, the process 400 proceeds to step 406.

At step 406, detection of errors in the data block is attempted. In a typical embodiment, errors can be detected in a plurality of ways. For example, one or more errors can be detected by the error pattern being a non-zero value. By way of further example, errors can be detected via error flags. In a typical embodiment, one or more error flags are associated with the receipt or reading of the data block. Such error flags are external to the error-correction scheme described herein. However, because the error-correction scheme described herein utilizes bit striping, the error flags are on a bit-stream-by-bit-stream basis and thus identify a particular bit stream as having an error (although no correction is specified). The error flags may be based on checksums, cyclic redundancy checks (CRCs), read failures, hardware-device failure, and/or the like. By way of further example, errors can be detected via a parity vector. From step 406, the process 400 proceeds to step 408.

At step 408, it is determined whether any errors were detected at step 406. If not, the process 400 proceeds to step 414 and ends without any errors needing to be corrected. If it is determined at step 408 that one or more errors were detected, the process 400 proceeds to step 410. At step 410, it is determined whether the one or more errors are correctable. In a typical embodiment, the following error scenarios may be correctable instantaneously: (1) Error flags exist for two bit streams and the error pattern is non-zero; (2) An error flag exists for a single bit stream and the error pattern is non-zero; (3) There are no error flags, the error pattern is non-zero, and a local parity vector (computed) and a transmitted parity vector (stored in the data block) are different (for a single bit-stream-in error); and (4) There are no error flags, a local parity vector (calculated) and a transmitted parity vector (stored in the data block) are different, and the error pattern is zero.

If it is determined at step 410 that the one or more errors are not correctable, the process 400 proceeds step 414 and ends without correcting any of the errors. If it is determined at step 410 that the one or more errors are correctable, the process 400 proceeds to step 412. At step 412, the one or more errors are corrected immediately according to the error scenario. Examples of processes that can be performed at step 412 will be described with respect to FIGS. 6-9. From step 412, the process 400 proceeds to step 414. At step 414, the process 400 ends.

An Example of a Data-Protection Module

Figure 5:
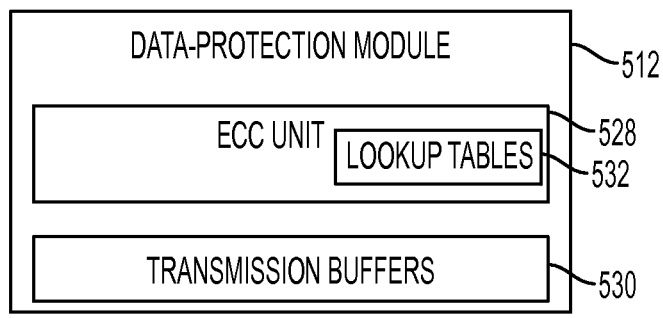
FIG. 5 illustrates a data-protection module.

FIG. 5 illustrates a data-protection module 512. In a typical embodiment, the data-protection module 512 may be implemented as the data-protection module 112 and/or the data-protection module 118 of FIG. 1. The data-protection module 512 includes an error-correction module 528 and a plurality of transmission buffers 530. In a typical embodiment, the error-correction module 528 performs the processes described above with respect to FIG. 3 and FIG. 4 and below with respect to FIGS. 6-9. The plurality of transmission buffers 530 serve to route bit streams in parallel to the storage interface controller 116 as described with respect to FIG. 1. In a typical embodiment, the plurality of transmission buffers 530 includes one transmission buffer for each bit stream of a given data block.

The error-correction module 528 includes a plurality of lookup tables 532. The plurality of lookup tables 532 may be, for example, ROM-based. As will be described in greater detail with respect to FIGS. 6-9, the plurality of lookup tables 532 contain pre-computed values, vectors, and/or matrices that are utilized for error correction. In that way, computations, and corresponding computation time, can be saved by performing lookups in the lookup tables 532 in place of performing the corresponding computations. This exemplary advantage can further speed up error correction. For example, Table 7 below lists exemplary lookup tables T1-T7 and Z1-Z2 that may be included among the plurality of lookup tables 532.

TABLE 7

| Table | Description |
|---|---|
| T1 | Provides a result of one LFSR cycle for each possible unshifted error pattern. |
| T2 | Provides a result of two LFSR cycles for each possible unshifted error pattern. |
| T3 | Provides a result of three LFSR cycles for each possible unshifted error pattern. |
| T4 | Provides a result of four LFSR cycles for each possible unshifted error pattern. |
| T5 | Provides a result of five LFSR cycles for each possible unshifted error pattern. |
| T6 | Provides a result of six LFSR cycles for each possible unshifted error pattern. |
| T7 | Provides a result of seven LFSR cycles for each possible unshifted error pattern. |

TABLE 7-continued

| Table | Description |
|---|---|
| Z1 | Accepts bit-stream difference between X and Y (i.e., 0 to 7) and lowest ordinal-numbered bit-stream-in-error (X as defined herein) as index and provides $\mathbb{K}$ 2 for each potential combination of bit-stream difference and lowest ordinal-numbered bit-stream-in-error. |
| Z2 | Accepts bit-stream difference between X and Y (i.e., 0 to 7) and highest ordinal-numbered bit-stream-in-error (Y as defined herein) as index and provides $\mathbb{K}$ 3 for each potential combination of bit-stream in error and lowest ordinal-numbered bit-stream-in-error. |

Tables T1-T7 contain pre-computed values resulting from a specified number of circular shifts of an LFSR. More specifically, with reference to FIG. 2, the values of Tables T1 to T7 result from circularly shifting a bit-reversed form of each possible error pattern (i.e., termed syndromes in FIG. 2). The LFSR embodied by Tables T1-T7 has been configured with g(x) (Equation 1) as divisor. Tables T1-T7 are indexed by unshifted error pattern. Therefore, each table can be accessed directly using an error pattern as calculated at step 404 of the process 400. T1 provides a value resulting from one circular shift of the LFSR for a given error pattern, T2 provides a value resulting from two circular shifts of the LFSR for a given error pattern, etc. An example of how Tables T1 to T7 can be utilized will be described with respect to FIG. 8.

In a typical embodiment, Tables Z1 and Z2 can be utilized to facilitate error correction of two bit-streams-in-error X and Y. As defined herein, between X and Y, the lowest ordinal-numbered bit stream is X and the highest ordinal-numbered bit stream is Y. Table Z1 accepts as index a bit-stream difference between X and Y (i.e., a number from 0 to 7, inclusive) and the lowest ordinal-numbered bit stream (i.e., X). Based on that index, Z1 is operable to provide $\mathbb{K}$ 2. In this fashion, Z1 contains a pre-computed $\mathbb{K}$ 2 for each potential index. Table Z2 accepts as index the bit-stream difference between X and Y (i.e., a number from 0 to 7, inclusive) and the highest ordinal-numbered bit stream (i.e., Y). Based on that index, Z2 is operable to provide $\mathbb{K}$ 3. In this fashion, Z2 contains a pre-computed $\mathbb{K}$ 3 for each potential index. An example of how Tables Z1 and Z2 can be utilized will be described with respect to FIG. 6.

Although examples of the plurality of lookup tables 532 are described above, in various embodiments, other values, vectors, and/or matrices can also be obtained in this fashion. For example, with respect to Equation 3 above, error-correction codes calculated by the LFSR described with respect to Equation 3 could be pre-computed, stored, and indexed by a finite set of dividends. The lookup table of error-correction codes could then be accessed by dividend whenever Equation 3 needed to be performed. For example, a thirty-two kilobyte lookup table with $2^{15}$ entries would yield any potential error-correction code.

By way of further example, with respect to Equation 4 above, in various embodiments, error-correction patterns calculated by the LFSR are pre-computed and stored in a lookup table. The lookup table of error patterns could be indexed by an address containing, for example, a bit position of the lowest ordinal-numbered bit stream (i.e., 0 to 7), a bit-stream difference between two bit-streams-in-error, and a sum of any bit-streams-in-error. If only a single bit stream is in error, the bit position of the lowest ordinal-numbered bit stream would be the bit position of the single bit-stream-in-error, the bit-stream difference would be zero, and the sum of the bit-streams-in-error would equal the value of the single bit-stream-in-error. Therefore, the lookup table of error patterns would be applicable both when one bit stream is error and when two bit streams are in error. Other computations may also be facilitated via utilization of lookup tables.

For illustrative purposes, the above examples of the plurality of lookup tables 532 correspond to specific equations described above. However, it should be appreciated that any of the equations described above can be algebraically manipulated in a fashion that will require corresponding changes to the plurality of lookup tables 532. It will be apparent to one of ordinary skill in the art, after reviewing the inventive principles described herein, that the plurality of lookup tables 532 can be easily conformed to the algebraic form of the equations to which they relate. Therefore, depending on embodiment, the plurality of lookup tables 532 can vary in number of tables, type of index, and values, vectors, and/or matrices provided thereby.

Example Error Correction Scenario #1

Error Flags Exist for Two Bit Streams and the Error Pattern is Non-Zero

Figure 6:
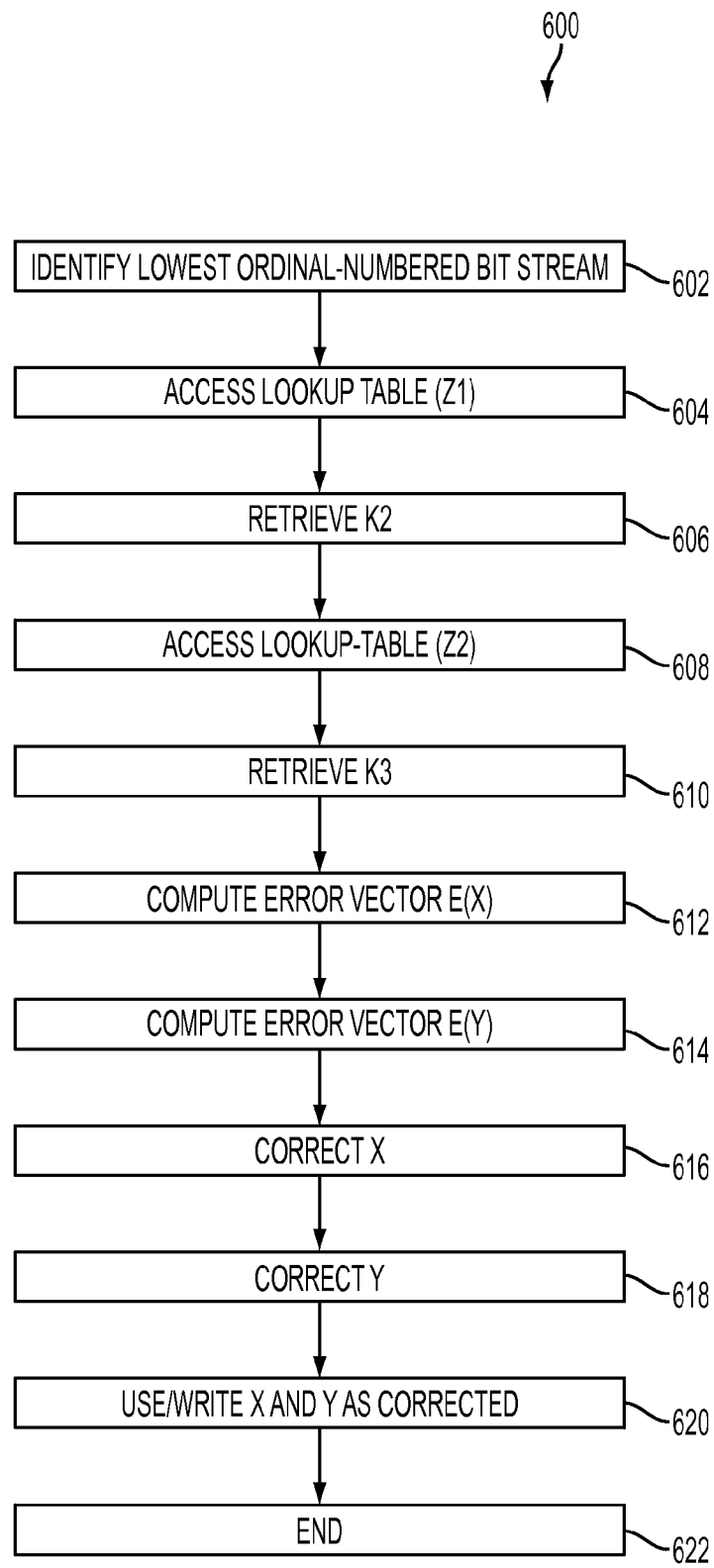
FIG. 6 illustrates a process for performing error correction.

FIG. 6 illustrates a process 600 for performing error correction of a data block. The process 600 may be performed, for example, as part of step 412 of the process 400 of FIG. 4. The process 600 particularly addresses an error scenario such that error flags identify two bit-streams-in-error (i.e., X and Y) and the error pattern is non-zero. The process 600 begins at step 602. At step 602, a lowest ordinal-numbered bit stream between X and Y is identified. As defined herein, the lowest ordinal-numbered bit stream is X. From step 602, the process 600 proceeds to step 604.

At step 604, the lookup table Z1 is accessed using a bit-stream difference between X and Y (i.e., a number between 0 and 7, inclusive) and the lowest ordinal-numbered bit stream (i.e., X) as an index. From step 604, the process 600 proceeds to step 606. At step 606, $\mathbb{K}$ 2 is retrieved from the lookup table Z1. From step 606, the process 600 proceeds to step 608. At step 608, the lookup table Z2 is accessed using a bit-stream difference between X and Y (i.e., a number between 0 and 7, inclusive) and the highest ordinal-numbered bit stream (i.e., Y) as an index. From step 608, the process 600 proceeds to step 610. At step 610, $\mathbb{K}$ 3 is retrieved from the lookup table Z3. From step 610, the process 600 proceeds to step 612.

At step 612, an error-correction vector E(X) is computed using, for example, Equation 14. From step 612, the process 600 proceeds to step 614. At step 614, an error-correction vector E(Y) is computed using, for example, Equation 15. From step 614, the process 600 proceeds to step 616. At step 616, X is corrected by adding E(X) to X (i.e., bitwise XOR). From step 616, the process 600 proceeds to step 618. At step 618, Y is corrected by adding E(Y) to Y (i.e., bitwise XOR). From step 618, the process 600 proceeds to step 620. At step 620, X and Y as corrected are used and/or written, as applicable to a particular implementation or purpose of the error correction. From step 620, the process 600 proceeds to step 622. At step 622, the process 600 ends.

It should be appreciated that, although the process 600 is listed as a series of sequential steps, various steps may occur in parallel. For example, steps 604-606 and 608-610 can occur in parallel. Other modifications and changes to the sequence of steps described above will be apparent to one of ordinary skill in the art after reviewing the inventive principles contained here.

Example Error Correction Scenario #2

Figure 7:
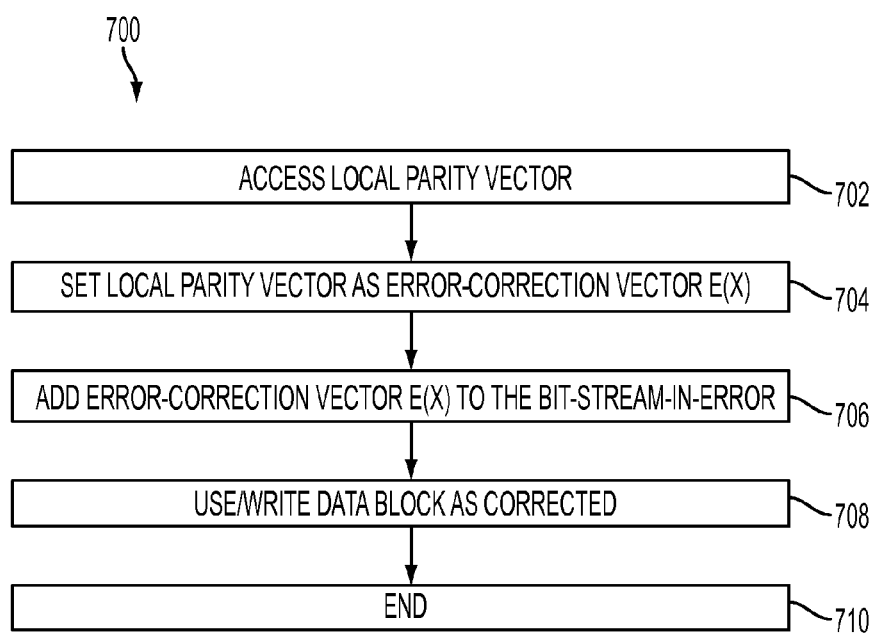
FIG. 7 illustrates a process for performing error correction.

An Error Flag Exists for a Single Bit Stream and the Error Pattern is Non-Zero FIG. 7 illustrates a process 700 for performing error correction of a data block. The process 700 may be performed, for example, as part of step 412 of the process 400 of FIG. 4. The process 700 particularly addresses an error scenario such that an error flag identifies a single bit-stream-in-error and the error pattern is non-zero. In this situation, the error-correction vector E(X) equals a local parity vector computed with respect to the data block. The process 700 begins at step 702.

At step 702, the local parity vector is accessed. If the local parity vector has not yet been computed, step 702 includes computing the local parity vector. It should be appreciated that the local parity vector is computed with respect to the first eight bit streams of the data block (i.e., excluding the transmitted parity vector). From step 702, the process 700 proceeds to step 704. At step 704, the local parity vector is set as an error-correction vector E(X) for the single bit-stream-in-error. From step 704, the process 700 proceeds to step 706. At step 706, the error-correction vector E(X) is added to the single bit-stream-in-error (i.e., bitwise XOR). From step 706, the process 700 proceeds to step 708. At step 708, the data block as corrected is used and/or written to storage, as applicable to a particular implementation or a purpose of the error correction. From step 708, the process 700 proceeds to step 710. At step 710, the process 700 ends.

It should be appreciated that, in various embodiments, a similar correction can also be made by performing a process similar to the process 600 of FIG. 6. Although only one bit stream is in error under this scenario, for purposes of rules-table lookups in Tables Z1 and Z2, zero can be used as a bit-stream difference and the single bit-stream-in-error can be treated as both the lowest ordinal-numbered bit stream and the highest ordinal-numbered bit stream. Thereafter, the error-correction vector E(X) can be computed as described with respect to the process 600. The single bit-stream-in-error can then be corrected as described above with respect to step 706 of the process 700.

Example Error Correction Scenario #3

Figure 8:
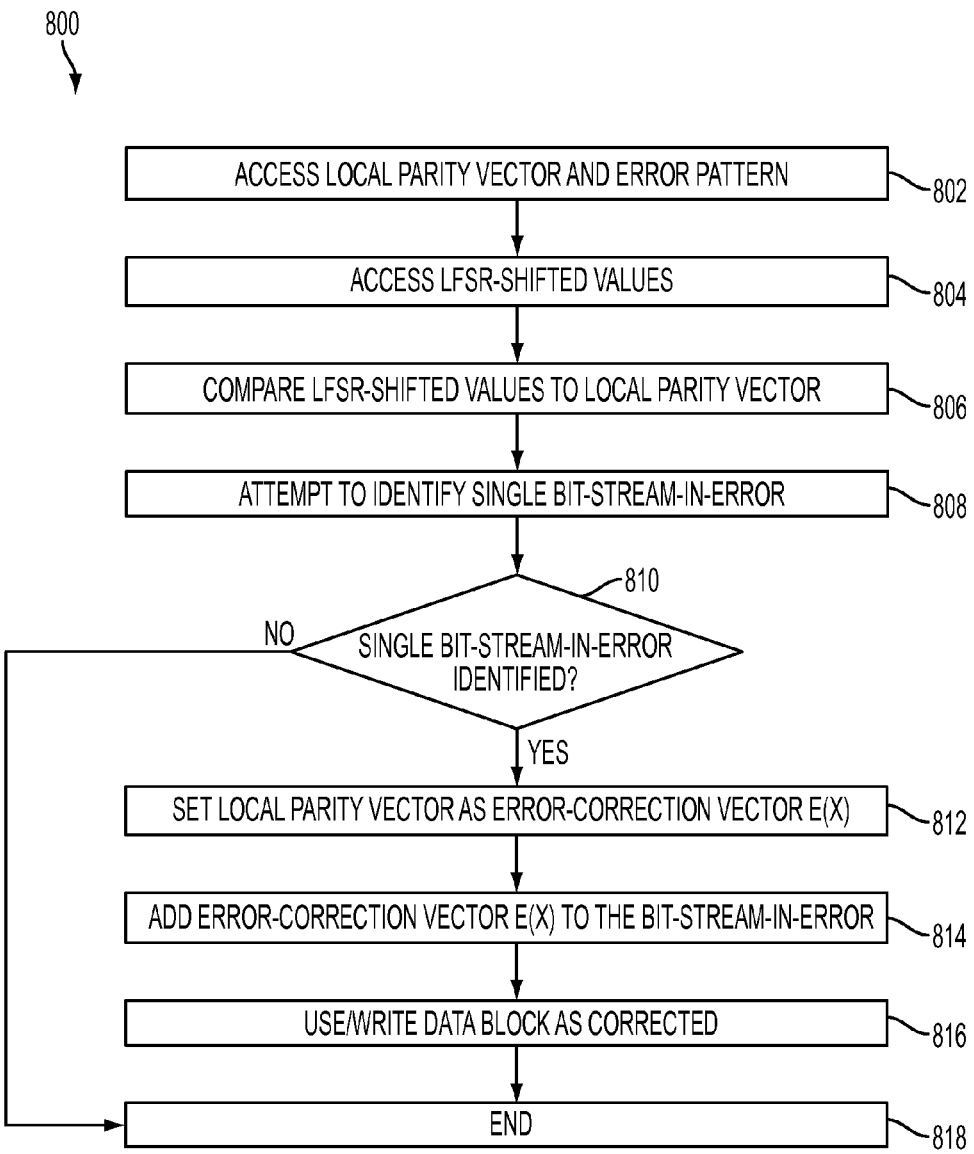
FIG. 8 illustrates a process for performing error correction.

There are No Error Flags, the Error Pattern is Non-Zero, and a Local Parity Vector (Computed) and a Transmitted Parity Vector (Stored in the Data Block) are Different FIG. 8 illustrates a process 800 for performing error correction of a data block. The process 800 may be performed, for example, as part of step 412 of the process 400 of FIG. 4. The process 800 particularly addresses an error scenario such that there are no error flags, the error pattern is non-zero, and a local parity vector (computed) and a transmitted parity vector (stored in the data block) are different. The process 800 begins at step 802. At step 802, a local parity vector and an error pattern for the data block are accessed. If the local parity vector has not yet been computed, step 802 includes computing the local parity vector. From step 802, the process 800 proceeds to step 804.

At step 804, LFSR-shifted values are accessed relative to a bit-reversed form of the error pattern. As described above with respect to FIG. 5 and Table 7, the LFSR-shifted values result from circularly shifting a bit-reversed form of the error pattern using an LFSR that has been configured with g(x) (Equation 1) as divisor. Specifically, step 804 encompasses accessing, in parallel, values for zero, one, two, three, four, five, six, and seven shifts. Values for shifts 1-7 are accessed from Tables T1-T7, respectively, using the error pattern as an index. No lookup table is necessary for zero shifts because that value is simply the error pattern in bit-reversed form. From step 804, the process 800 proceeds to step 806.

At step 806, the LFSR-shifted values are compared, in parallel, to the local parity vector. From step 806, the process 800 proceeds to step 808. At step 808, an attempt is made to identify a single bit-stream-in-error. A single bit-stream-in-error can be identified based on the comparisons at step 806. In particular, if a zero-shift value equals the local parity vector, then bit stream 0 is identified as a single bit-stream-in-error. If a one-shift value equals the local parity vector, then bit stream 1 is identified as a single bit-stream-in-error, etc. Therefore, a single bit-stream-in-error can be identified by a number of cycles of the LFSR necessary for the LFSR-shifted value to equal the local parity vector. If none of the LFSR-shifted values equals the local parity vector, this usually means that more than bit stream is in error and that no corrections can be made. From step 808, the process 800 proceeds to step 810.

At step 810, it is determined whether a single bit-stream-in-error was identified at step 808. If not, the process 800 proceeds to step 818 without any corrections being made. Alternatively, if a single bit-stream-in-error was identified at step 808, the process 800 proceeds to step 812. At step 812, the local parity vector is set as an error-correction vector E(X) for the single bit-stream-in-error. From step 812, the process 800 proceeds to step 814. At step 814, the error-correction vector E(X) is added to the bit-stream-in-error (i.e., bitwise XOR). From step 814, the process 800 proceeds to step 816. At step 816, the data block as corrected is used and/or written to storage, as applicable to a particular implementation or a purpose of the error correction. From step 816, the process 800 proceeds to step 818. At step 818, the process 800 ends.

Example Error Correction Scenario #4

Figure 9:
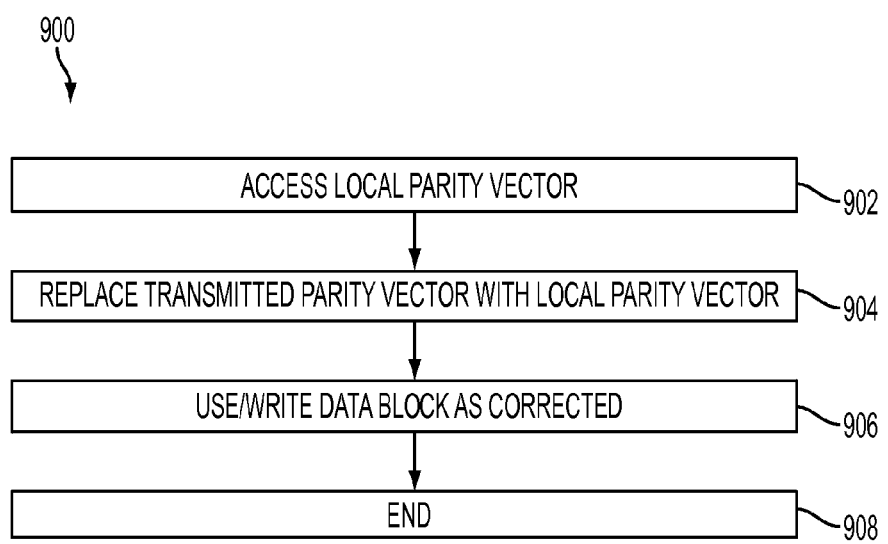
FIG. 9 illustrates a process for performing error correction.

There are No Error Flags, a Local Parity Vector (Calculated) and a Transmitted Parity Vector (Stored in the Data Block) are Different, and the Error Pattern is Zero FIG. 9 illustrates a process 900 for performing error correction of a data block. The process 900 may be performed, for example, as part of step 412 of the process 400 of FIG. 4. The process 900 particularly addresses an error scenario such that there are no error flags, a local parity vector (computed) does not match a transmitted parity vector (i.e., the parity vector in the data block), and the error pattern is zero. The process 900 begins at step 902.

At step 902, the local parity vector is accessed. From step 902, the process 900 proceeds to step 904. At step 904, the transmitted parity vector is replaced by the local parity vector. From step 904, the process 900 proceeds to step 906. At step 906, the data block as corrected is used and/or written to storage, as applicable to a particular implementation or a purpose of the error correction. From step 906, the process 900 proceeds to step 908. At step 908, the process 900 ends.

Numerous advantages can be realized utilizing principles described above with respect to FIGS. 1-9. Error correction can be utilized to perform sector correction, bit stream correction, or drive correction while maintaining functionality of an applicable storage system. For example, reconstruction of an entire RAID array can be achieved without taking a RAID system out of service provided the requirements of error correction as described above are met. By way of further example, interleaved failures where multiple sectors on multiple storage elements have failed can be corrected so long as no more than two mapped sectors fail in parallel on separate storage elements at any one time. In addition, because data is transmitted and stored as bit streams, data is protected both inflight and on storage units. Further, on data read, corrected data may be immediately written to an originating storage unit so that a stream of corrected data continues un-interrupted to a requesting host.

Exemplary Circuitry for a Data-Protection Module

In various embodiments, error-correction circuitry contained within a data-protection module can be implemented using a clocked eight bit register with a reset-to-zero signal. The register buffers the bytes on input to an error-correction generator (see FIGS. 10A-10B). The number of bytes clocked into the error-correction generator depends on whether the task is encoding an error-correction code or checking for a non-zero error syndrome. For the case of encoding, seven bytes clock through the error-correction generator, with an output of the circuit after the seventh byte being the error-correction code. This byte loads into a transmission buffer on the next strobe and the register is zeroed preparatory to creating a next error-correction code for a next data block.

Figure 15:
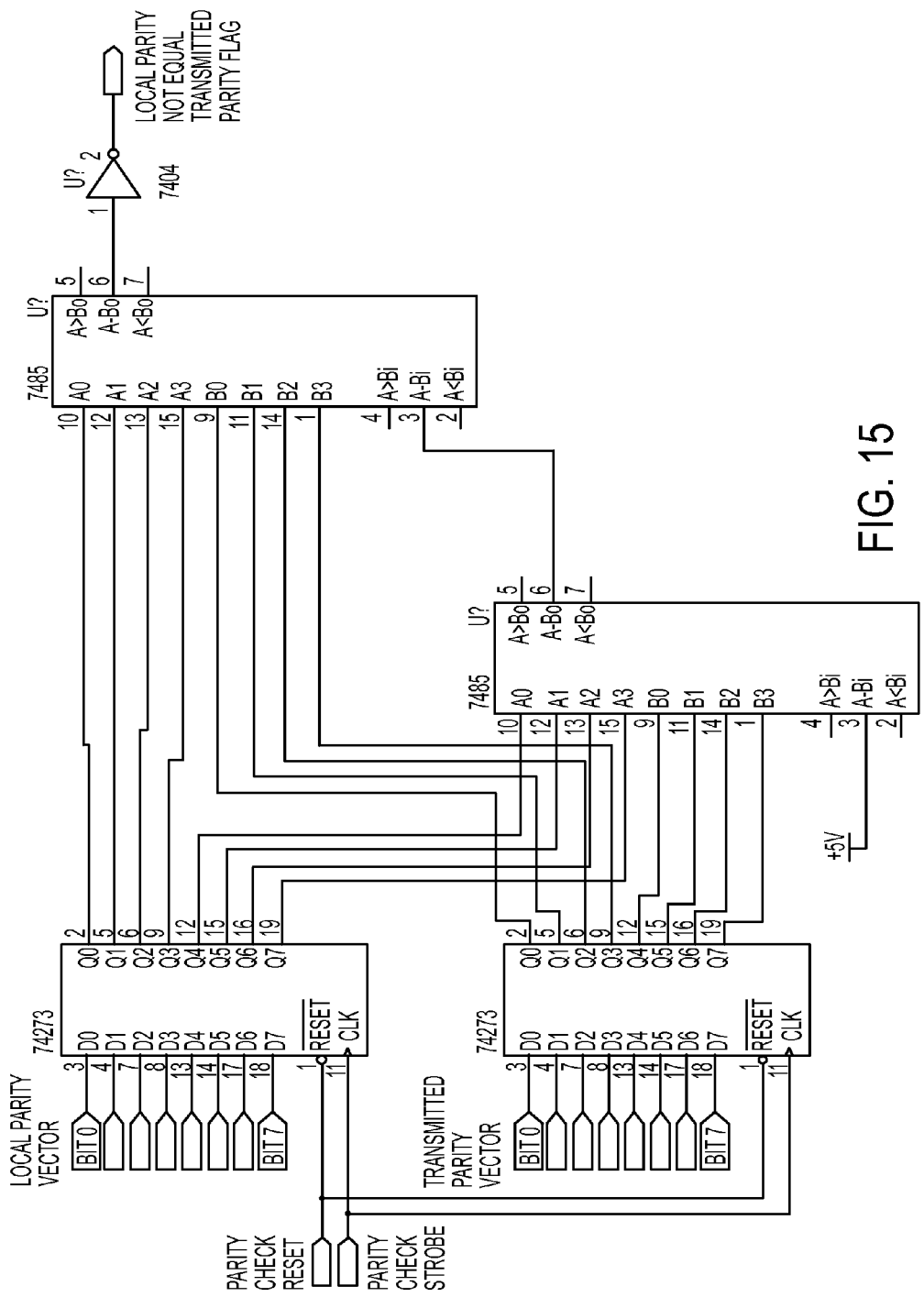

For the case of decoding, the error-correction generator is cleared and eight data bytes clocked by the data transfer strobe into the error-correction generator. The output is compared to zero in a syndrome-check circuit element. If a local parity vector matches a transmitted parity vector, and no bit-stream-in-error flags are set, then the data is valid and may be strobed into host interface circuitry as seen in FIG. 15. If fewer than three bit streams are flagged as in error, and if the syndrome is non-zero with either two errors flagged, or a single error is flagged, then error correction can be accomplished.

Figure 10A:
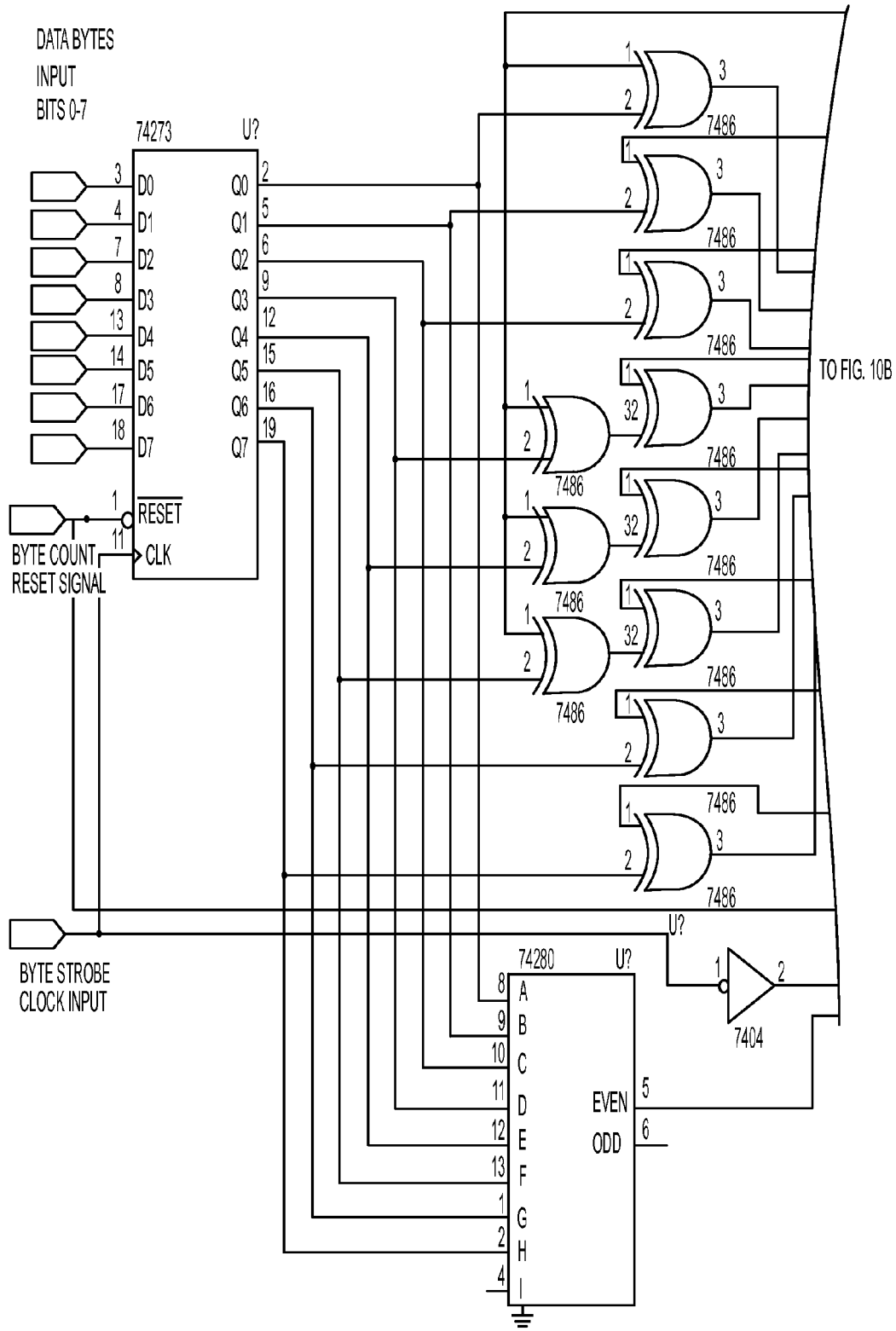
FIGS. 10A-24B illustrate examples of error-correction circuitry.
Figure 10B:
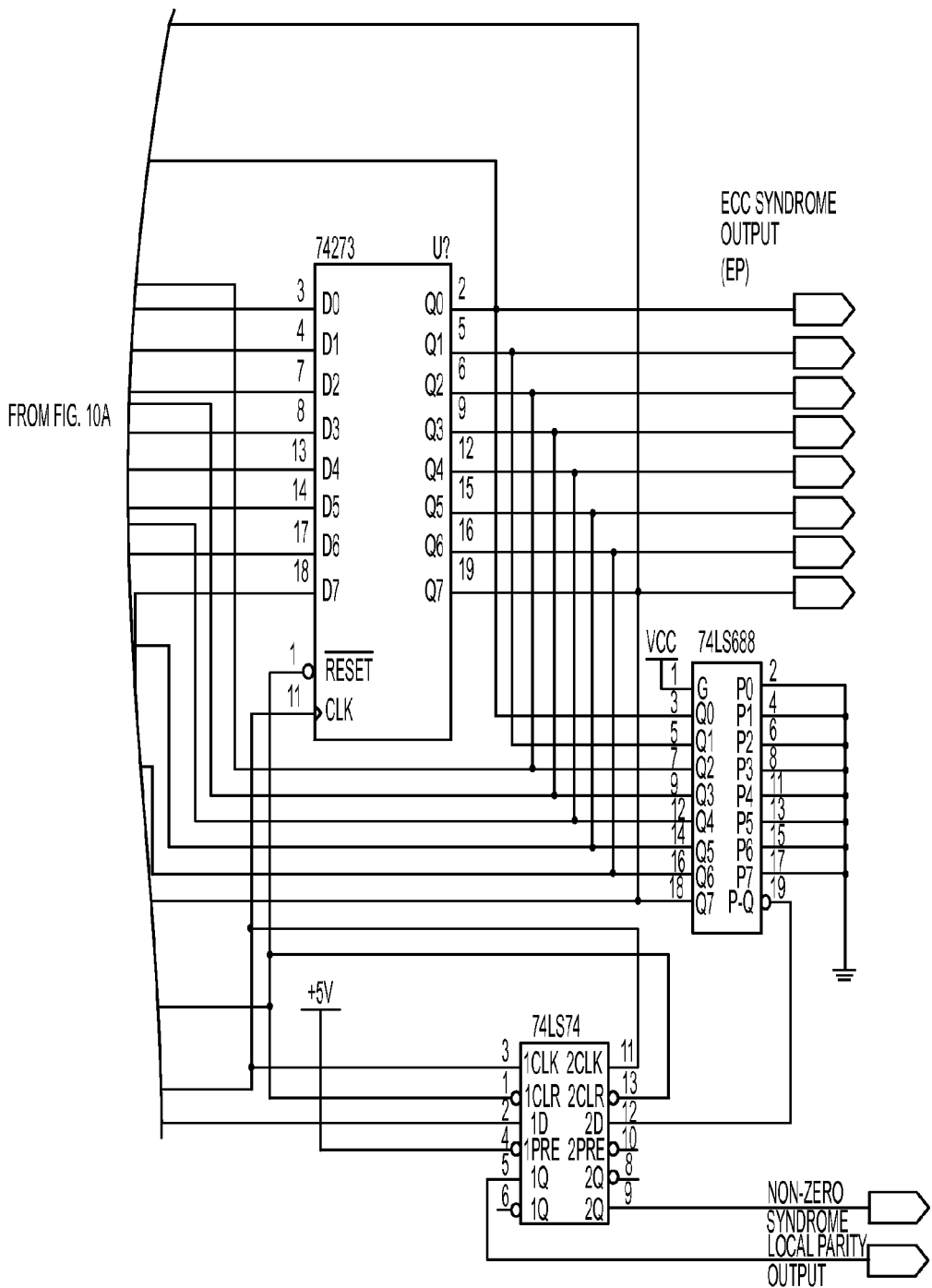

FIGS. 10A-10B are a diagram of error-correction code generation circuitry. FIG. 10 illustrates an input register, control signals, and local parity vector creation. The output is an error pattern as described above.

Figure 11:
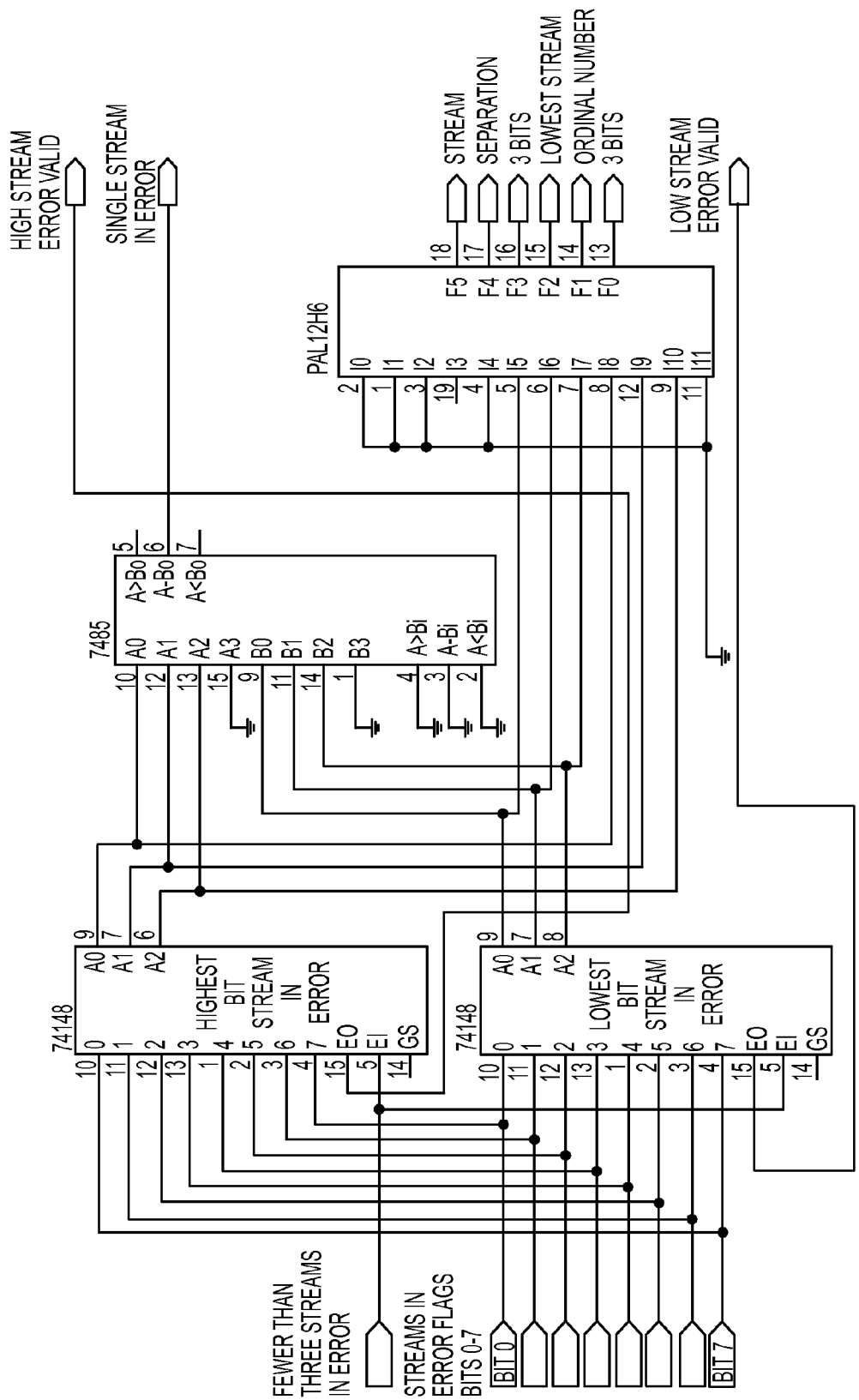

FIG. 11 illustrates circuitry used to determine a lowest ordinal-numbered bit stream, a highest ordinal-numbered bit stream, and a bit-stream difference. As shown, the outputs are valid if and only if there are two or fewer errors in the transmission.

Figure 12:
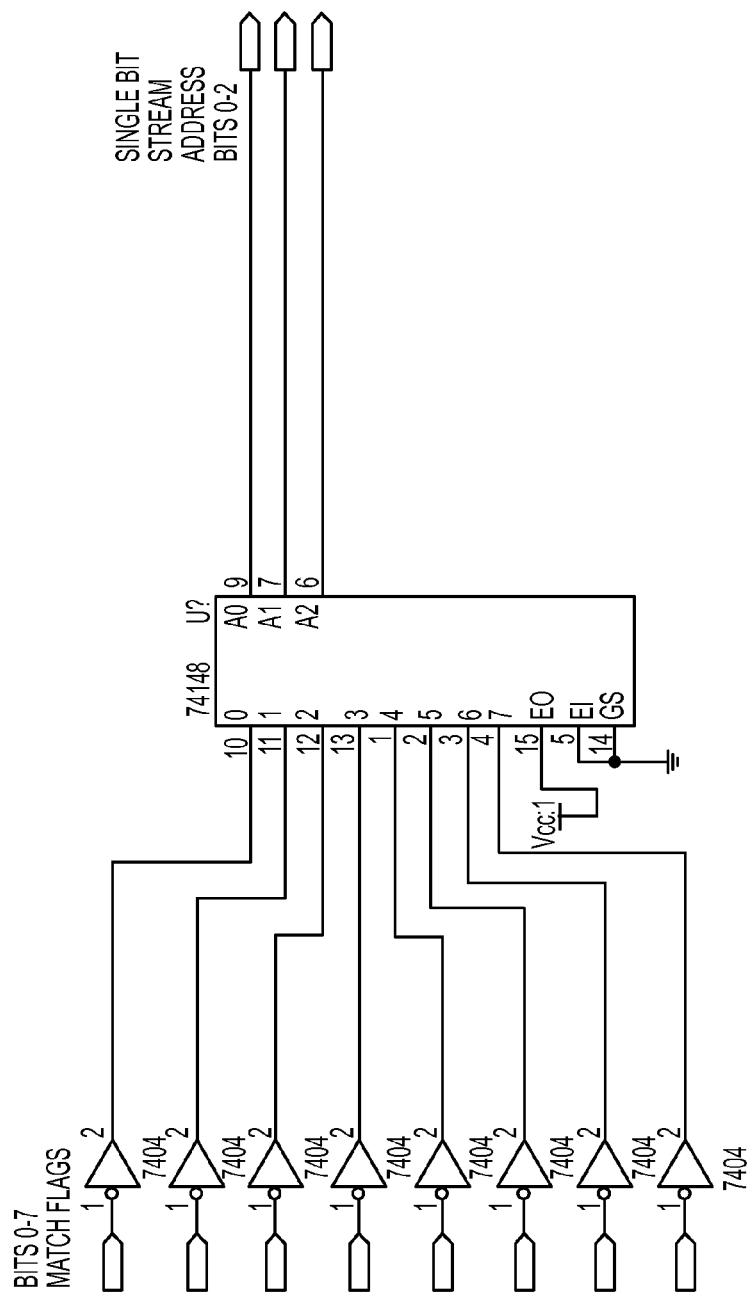
Figure 13:
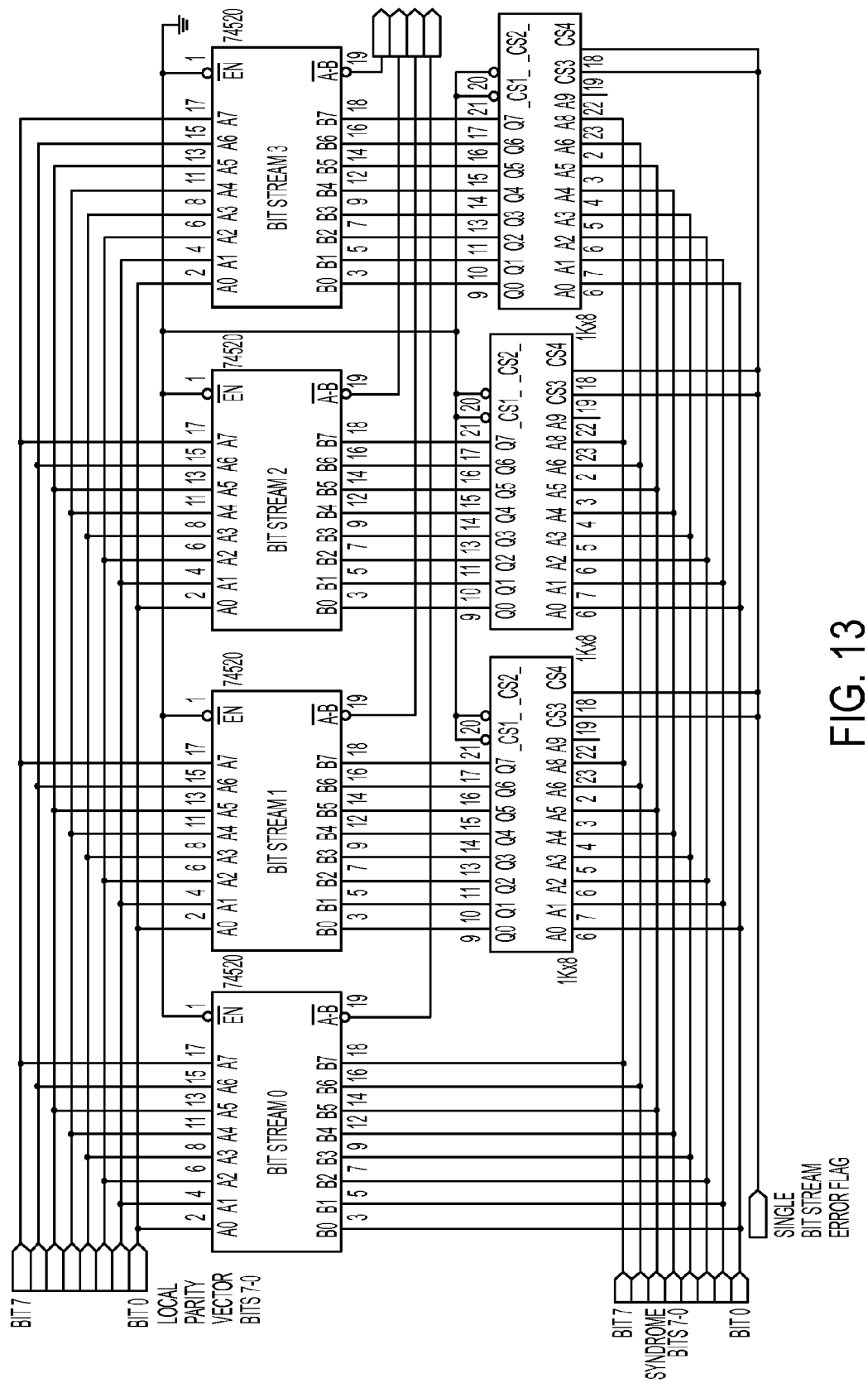

FIGS. 12-13 illustrate single bit-stream-in-error detection circuitry used when there is a non-zero syndrome with no bit-stream-in-error flag present. FIG. 12 illustrates a first part of the circuitry and FIG. 13 illustrates a second part of the circuitry.

Figure 14:
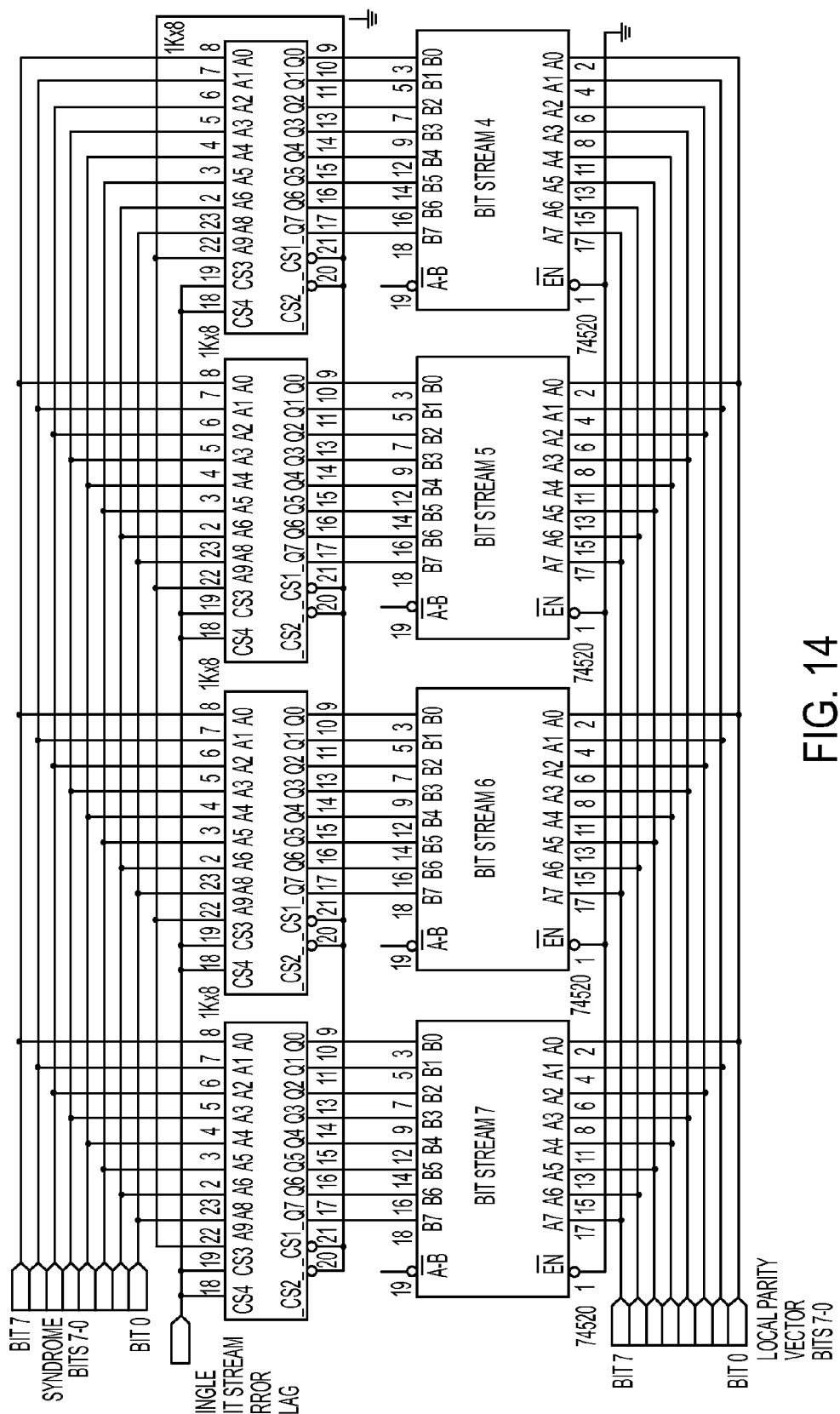

FIG. 14 illustrates an error-flag decoding circuit that uses the flags from FIGS. 12-13 to encode the bit-stream-in-error.

FIG. 15 illustrates a parity comparator that compares transmitted parity with that generated by a local-parity-vector generator. If the two are not equal, then there is an error within the block.

Figure 16:
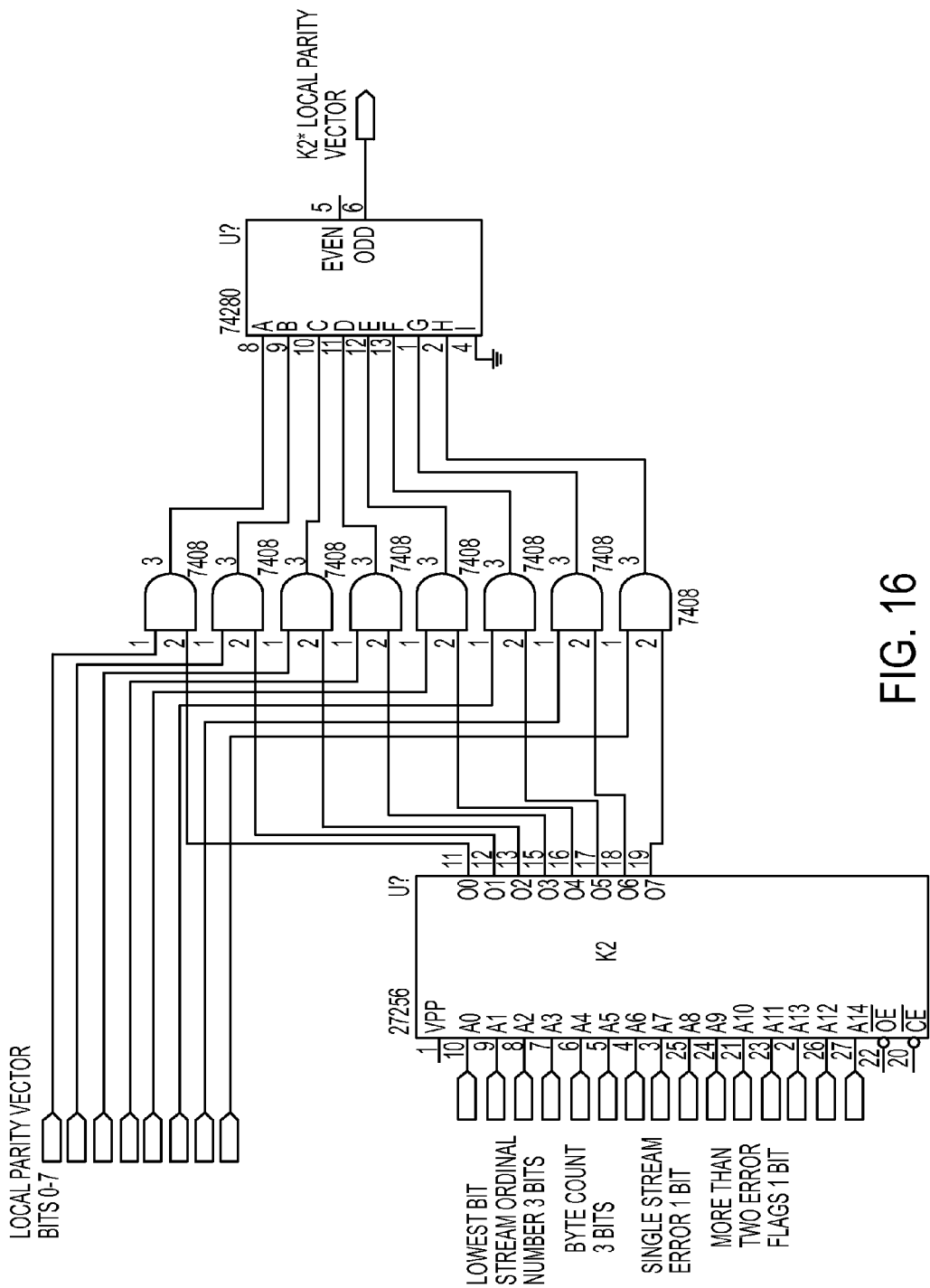
Figure 17:
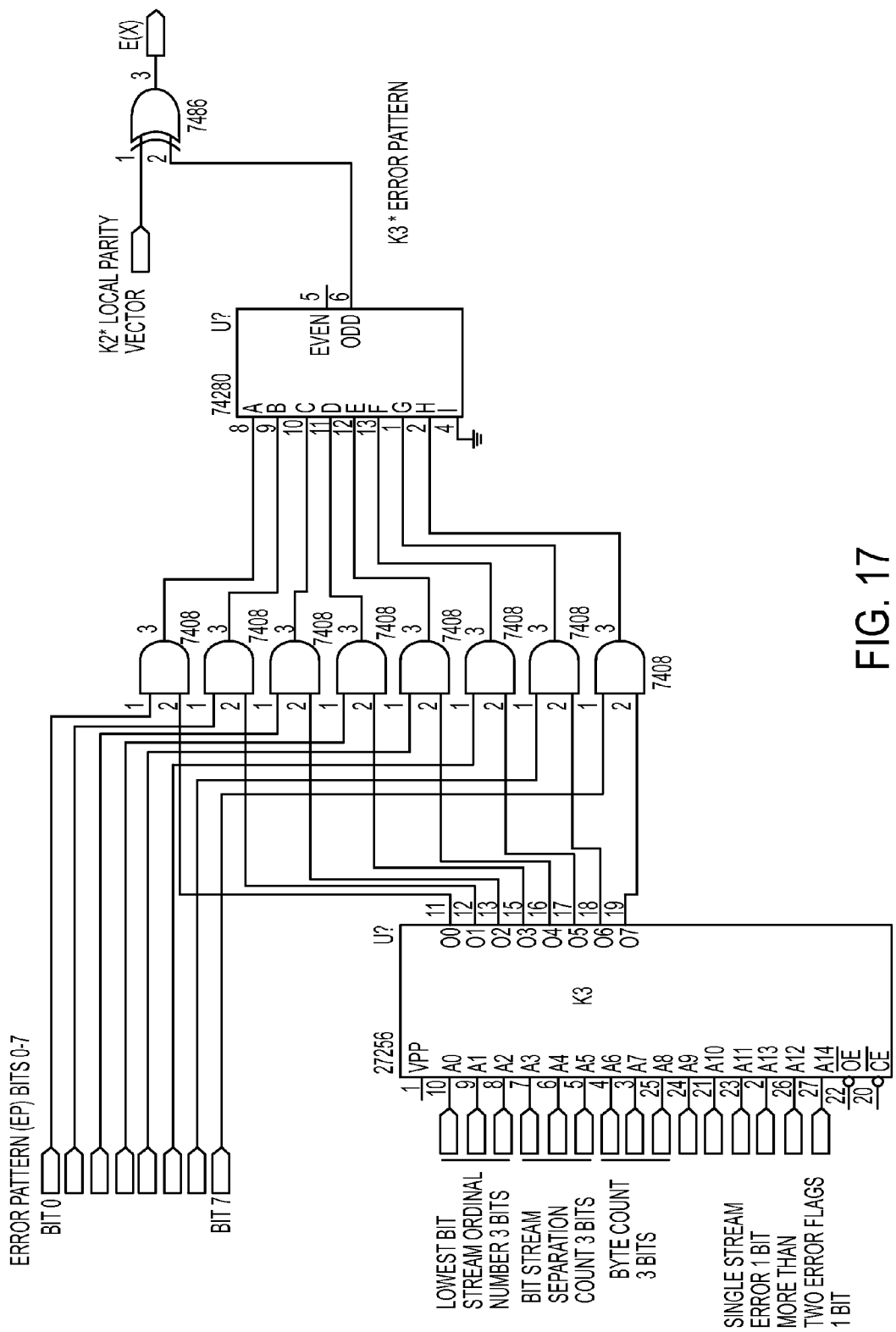

FIGS. 16-17 illustrate two bit-stream-in-error circuitry. In particular, FIG. 16 shows multiplication of $\mathbb{K}$ 2 with the local parity vector. This multiplication occurs on a bit by bit basis, and the bit is generated from a sum of the vector bits using a parity generator.

FIG. 17 illustrates matrix multiplication of EP(X, Y) and $\mathbb{K}$ 3. As in FIG. 8, the sum of the bits producing the result is accomplished using a parity generator. The final sum is accomplished taking the output of FIG. 16 and XORing it with the output of the parity generator, thereby resulting in E(X).

Figure 18:
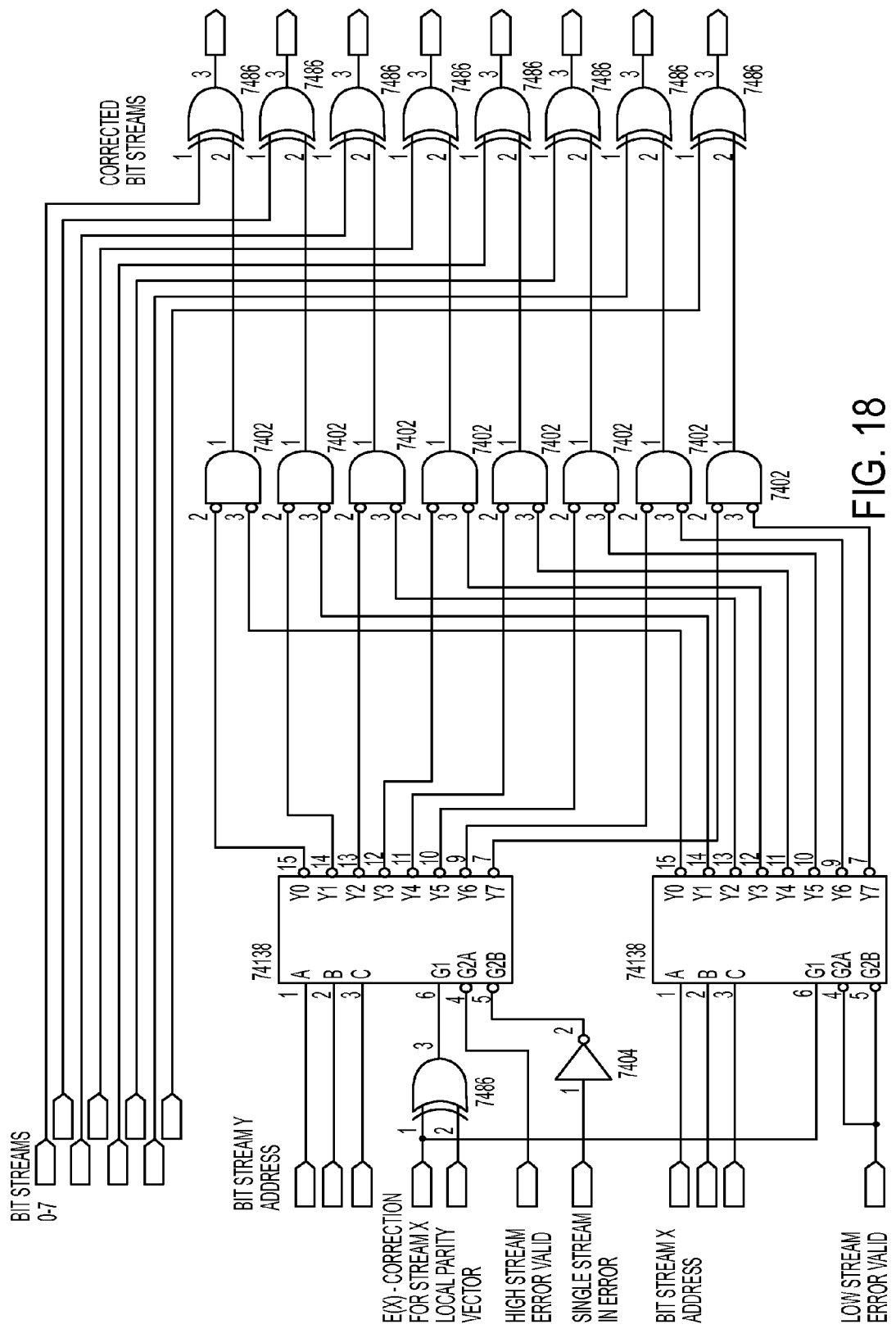

FIG. 18 illustrates circuitry used to correct the bit-stream-in-error using E(X) and the local parity vector. All bit streams are fed into this circuit and it selects the streams to be corrected using the addresses of bit streams X and Y. The correction occurs on a bit-by-bit basis using an XOR gate. Should only a single bit stream be in error, a single bit-stream-in-error flag disables the Y bit stream correction, and the bit stream is corrected using E(X) XORed with the local parity, as was previously described.

FIGS. 19A-20B illustrate circuitry to convert a data block into bit streams for transmission via a network interface. The bit streams typically go directly to transmission buffers for individual network connections. During a write operation, data is presented to buffer memory from an error-correction module (or unit). The error correction module is configured to write eight bytes (64 bits) at a time. Upon completion of error-correction code generation, the register is strobed, thereby writing the data into the associated address. This operation continues until the data buffer reaches the point where the transfer to a storage elements starts.

Figure 19A:
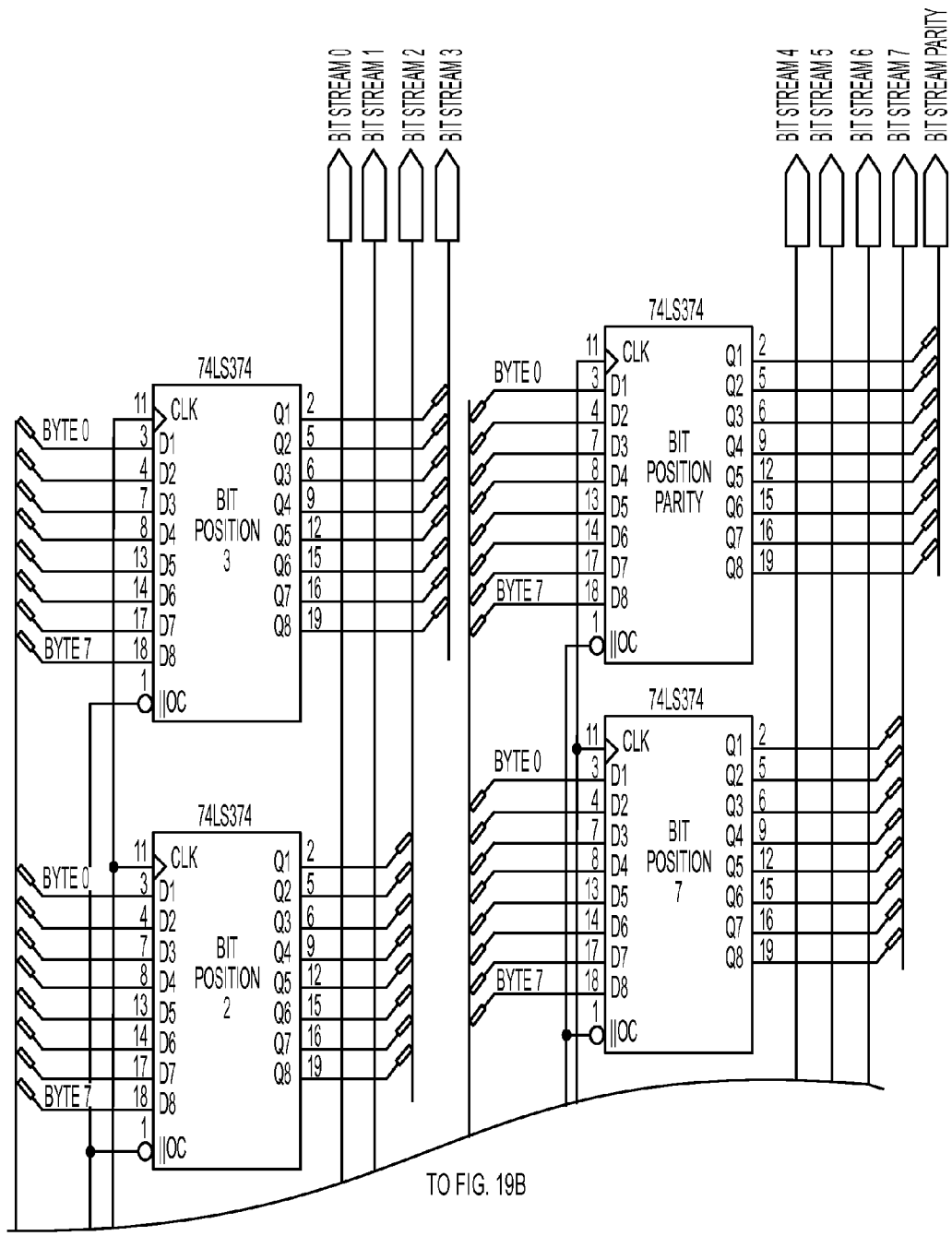
Figure 19B:
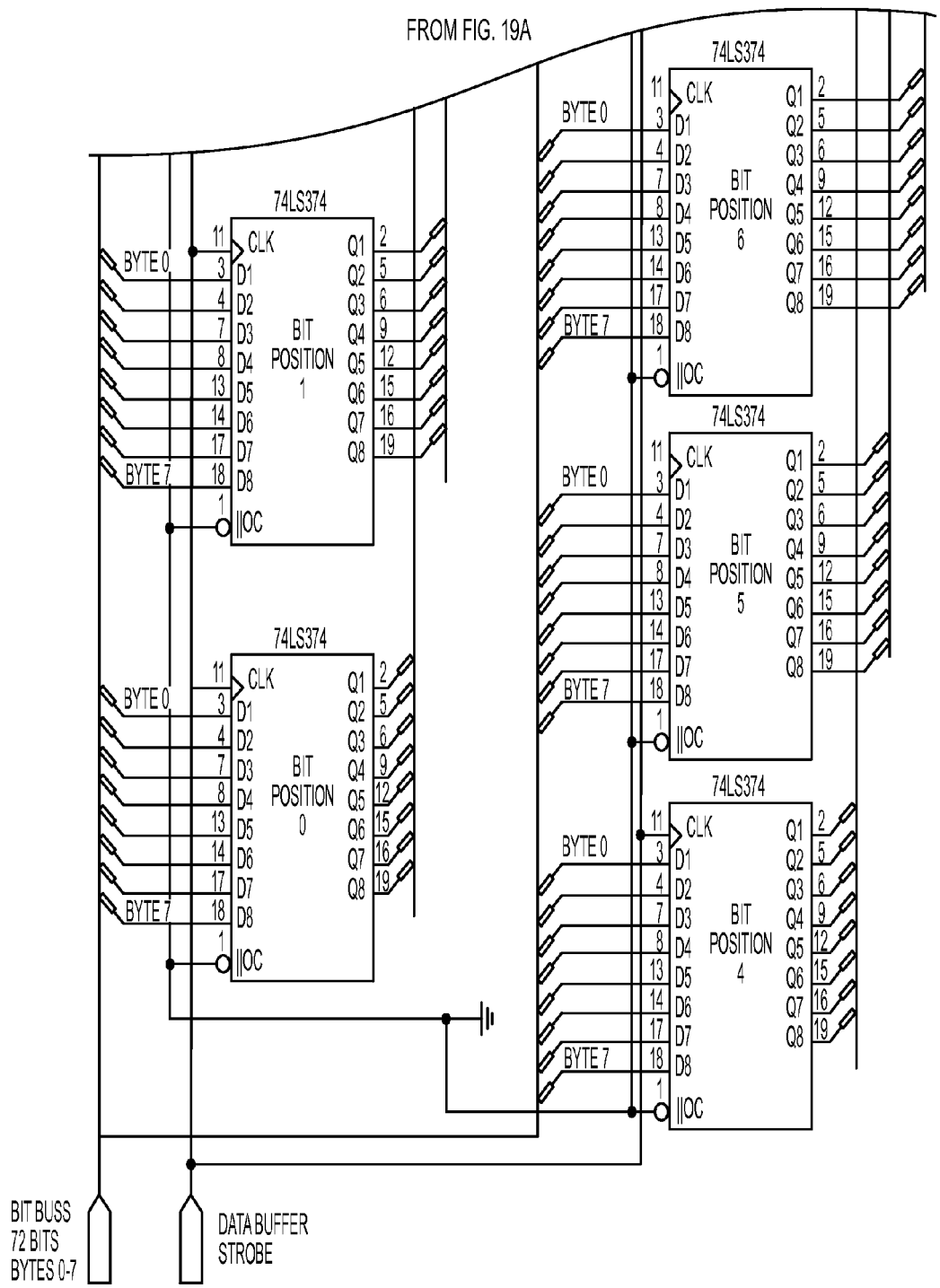
Figure 20A:
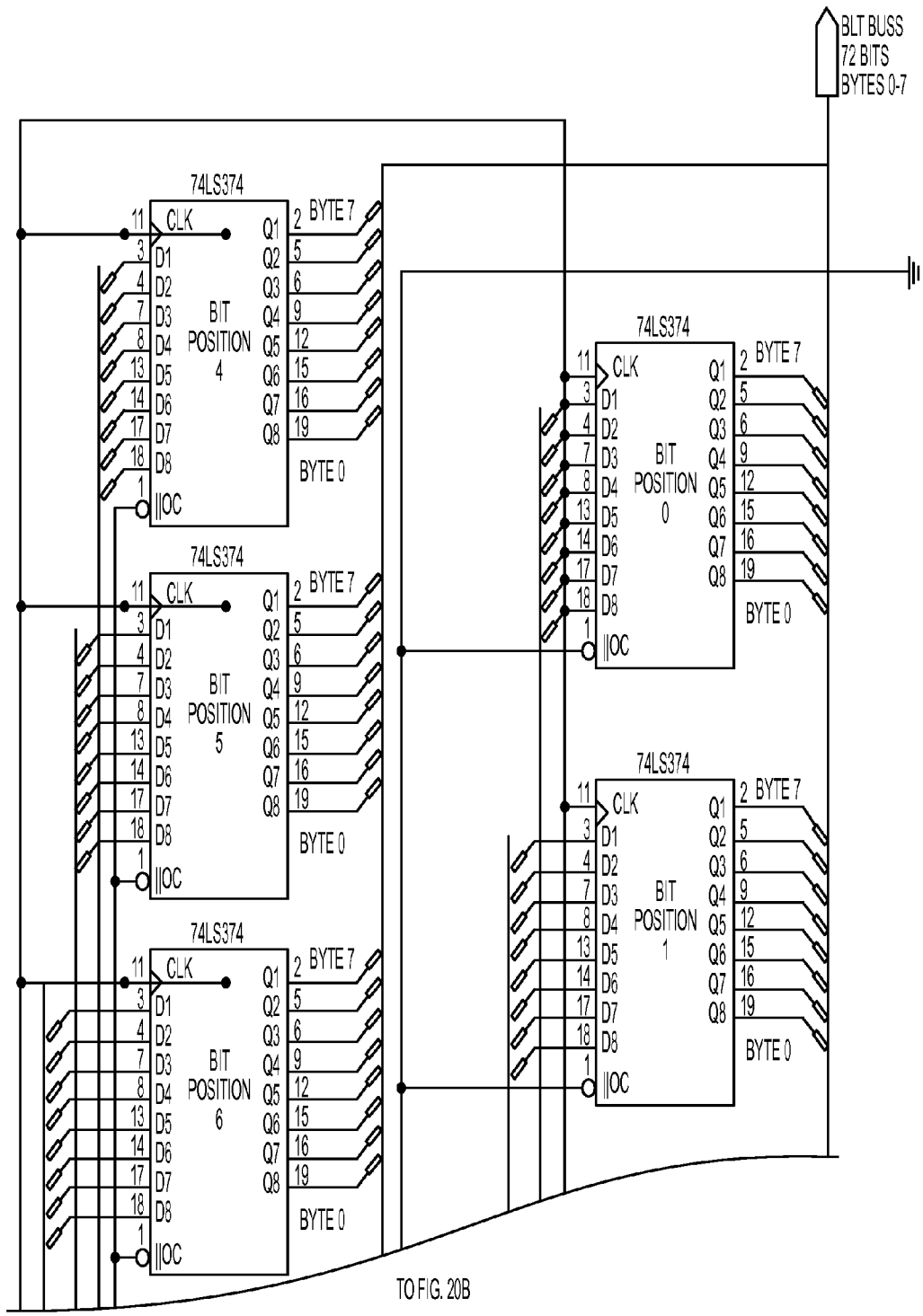
Figure 20B:
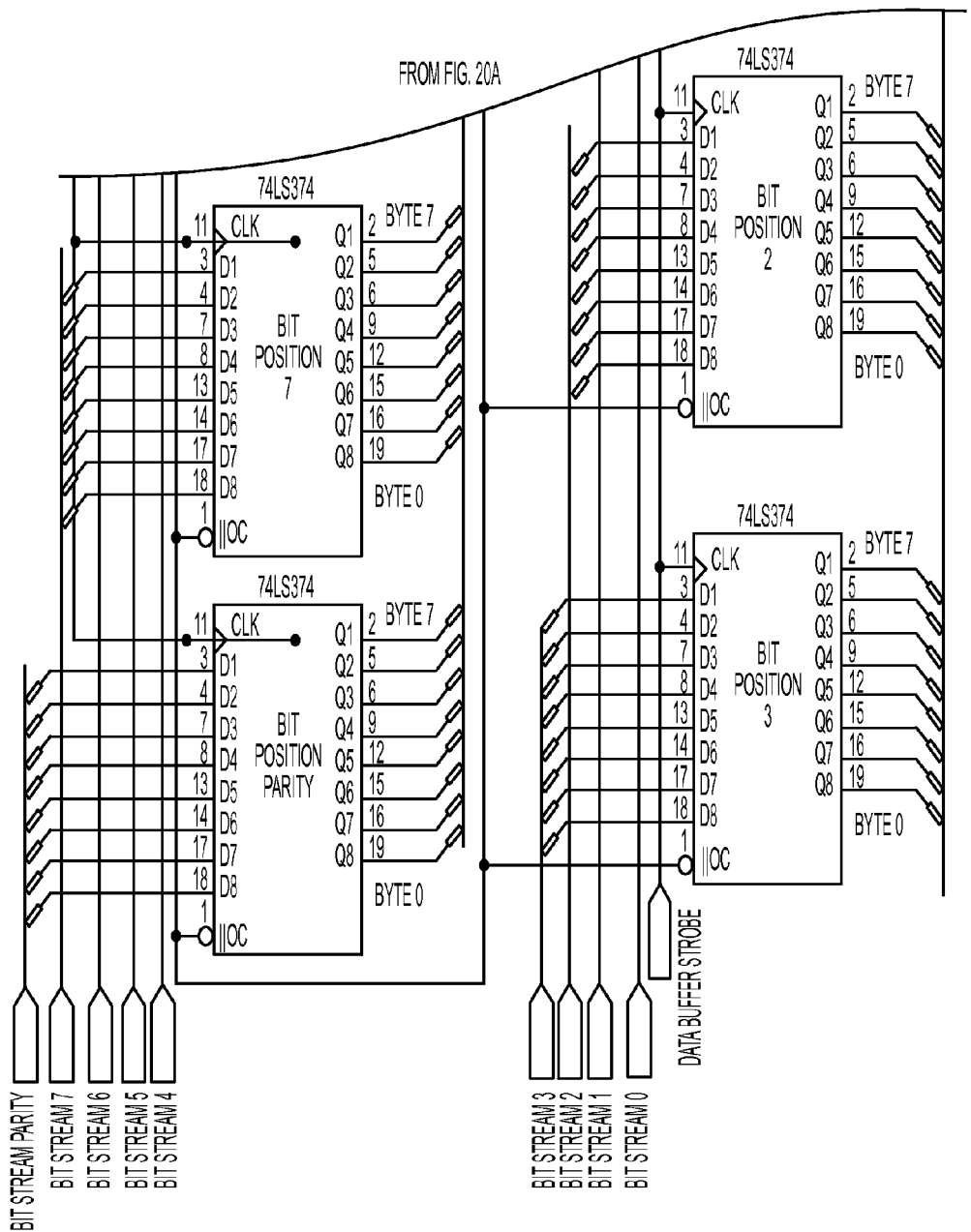

Upon receiving a remote-write enable, the read cycle from the data buffer starts. As can be seen in FIGS. 19A-19B, the data has been stored in the buffer memory by using registers orthogonal to the server registers. These registers are aligned with the memory planes. The starting read address is set up and commences the read cycle. Data from the memory is strobed into the registers, and then the registers are read by network transmission units. Upon completion of the last read, the registers are re-strobed for the next read cycle.

The correction buffer memory includes two memory planes as previously discussed. When one or two bit-streams-in-error are detected during error correction, the data is generally corrected in storage. The existence of an error in any block can cause a bad sector data flag associated with the current sector to be set. This causes the ECC unit to run a corrected bit stream to a backup drive for that particular sector. By having sector level bit stream backups, the size of the replicated data is minimized. In addition, the bad sector may be remapped by the failing drive or drive controller, and the correct data can be written immediately to the drive, saving the time of a full disk restore. As the nature of the storage interconnect is that of a switched network, and security is important, the buffer memory clears via a upon a reroute command from the storage interface control processor. Clearing prevents accidental buffer content exposure between two separate users.

Figure 21:
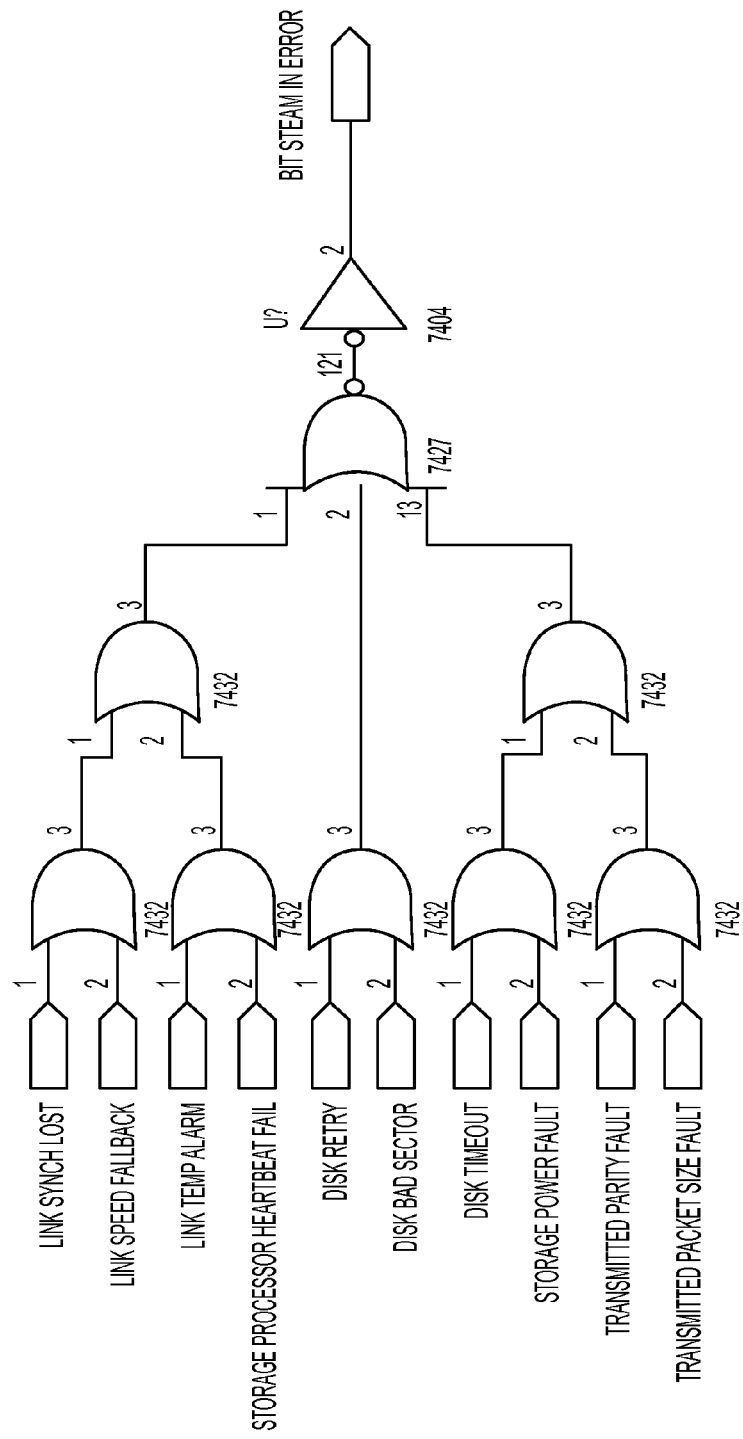
Figure 22A:
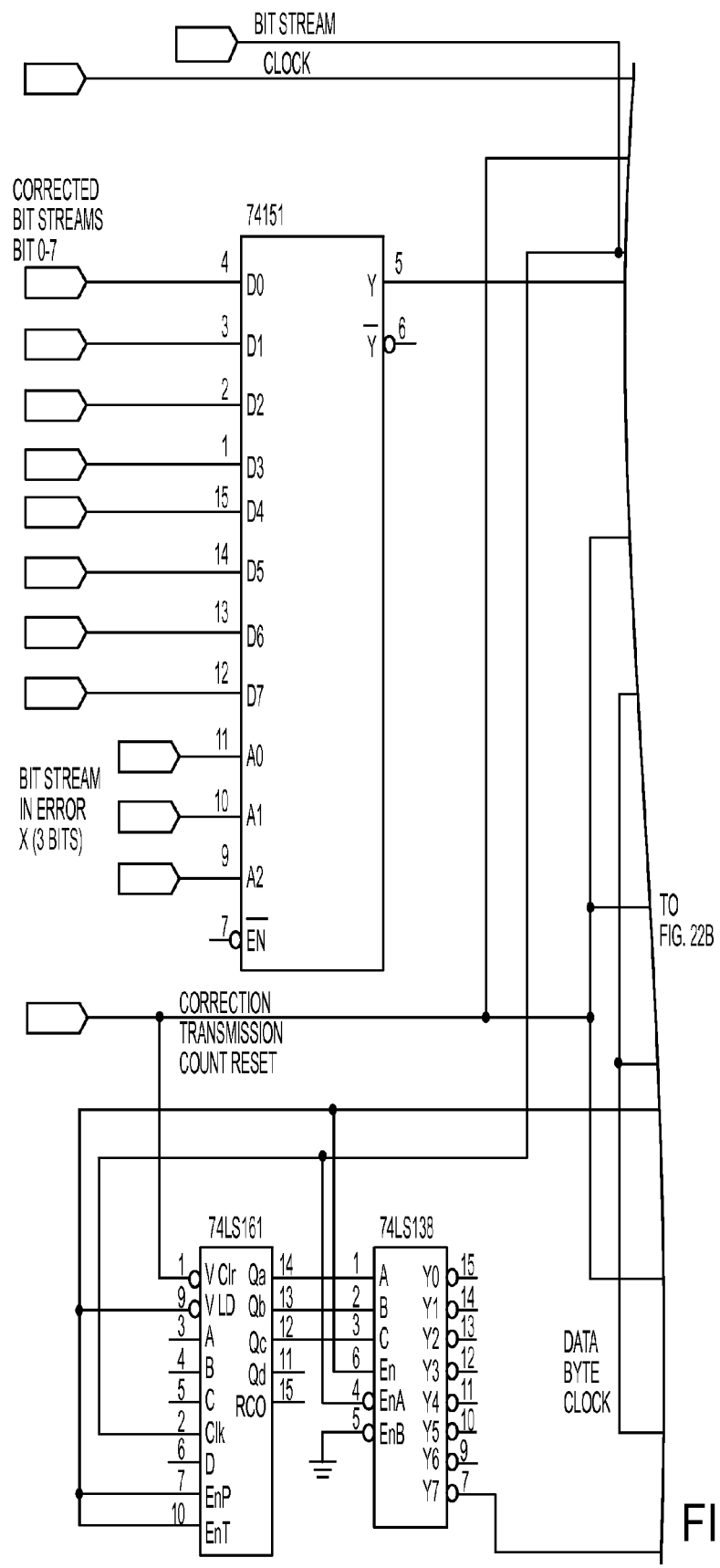
Figure 22B:
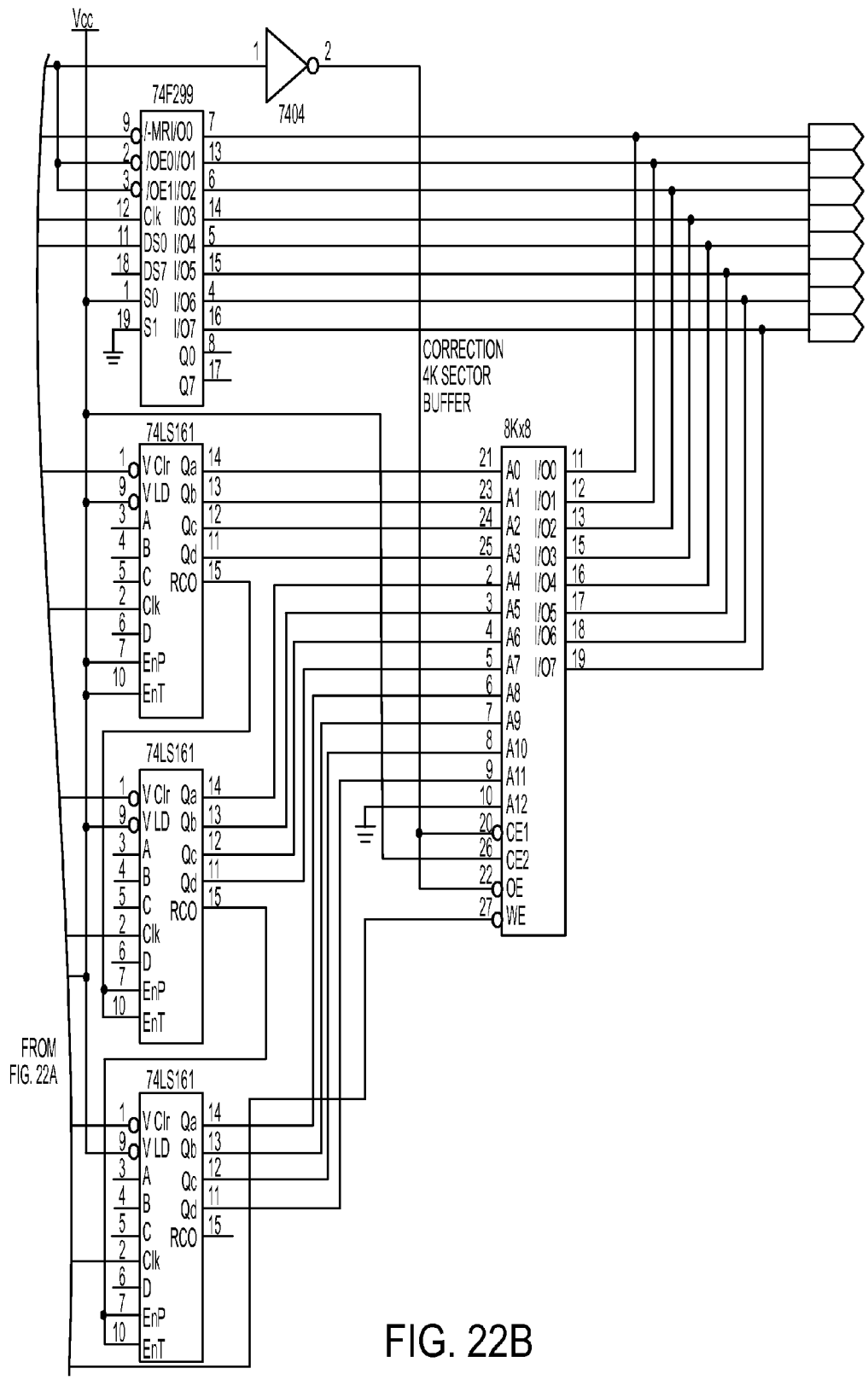
Figure 23A:
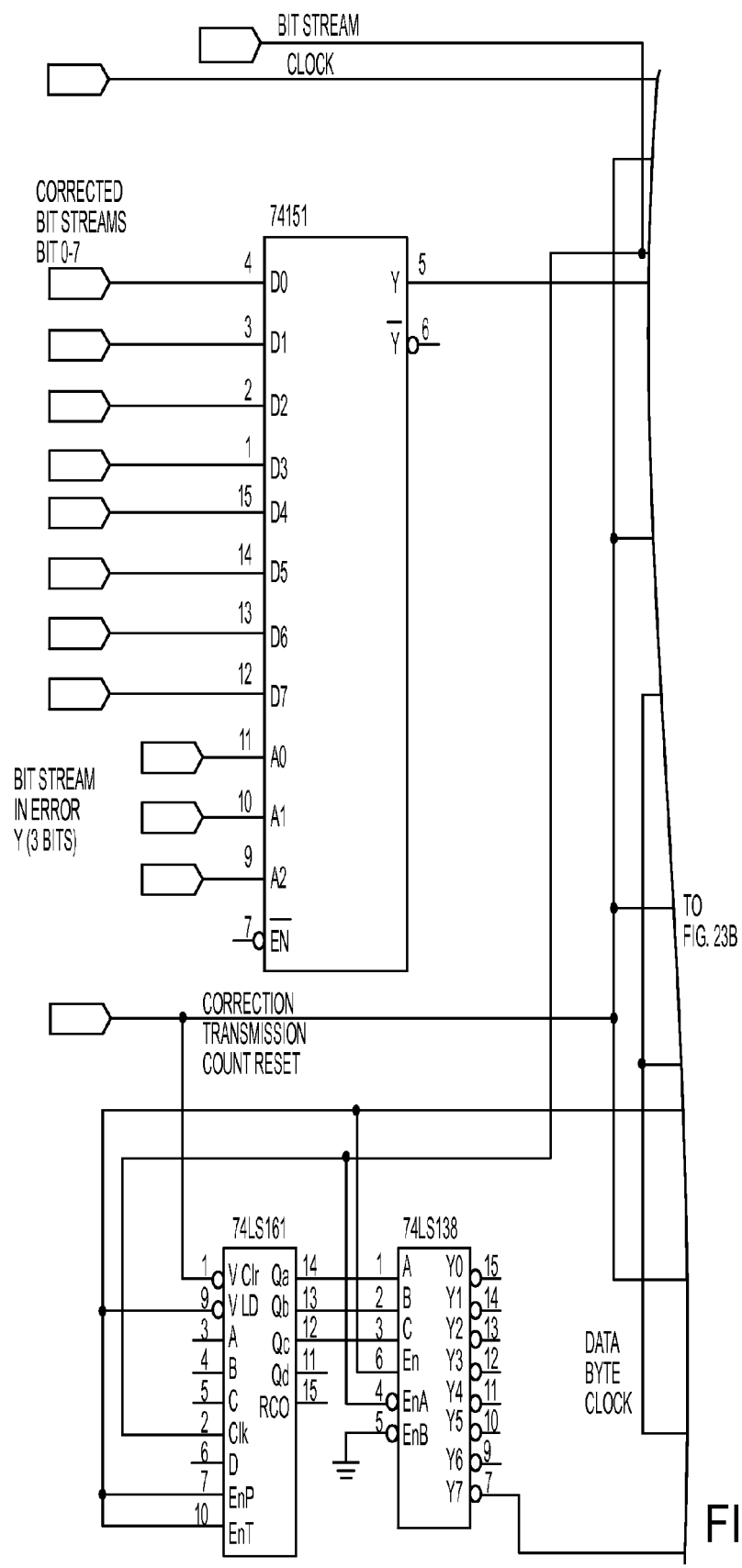
Figure 23B:
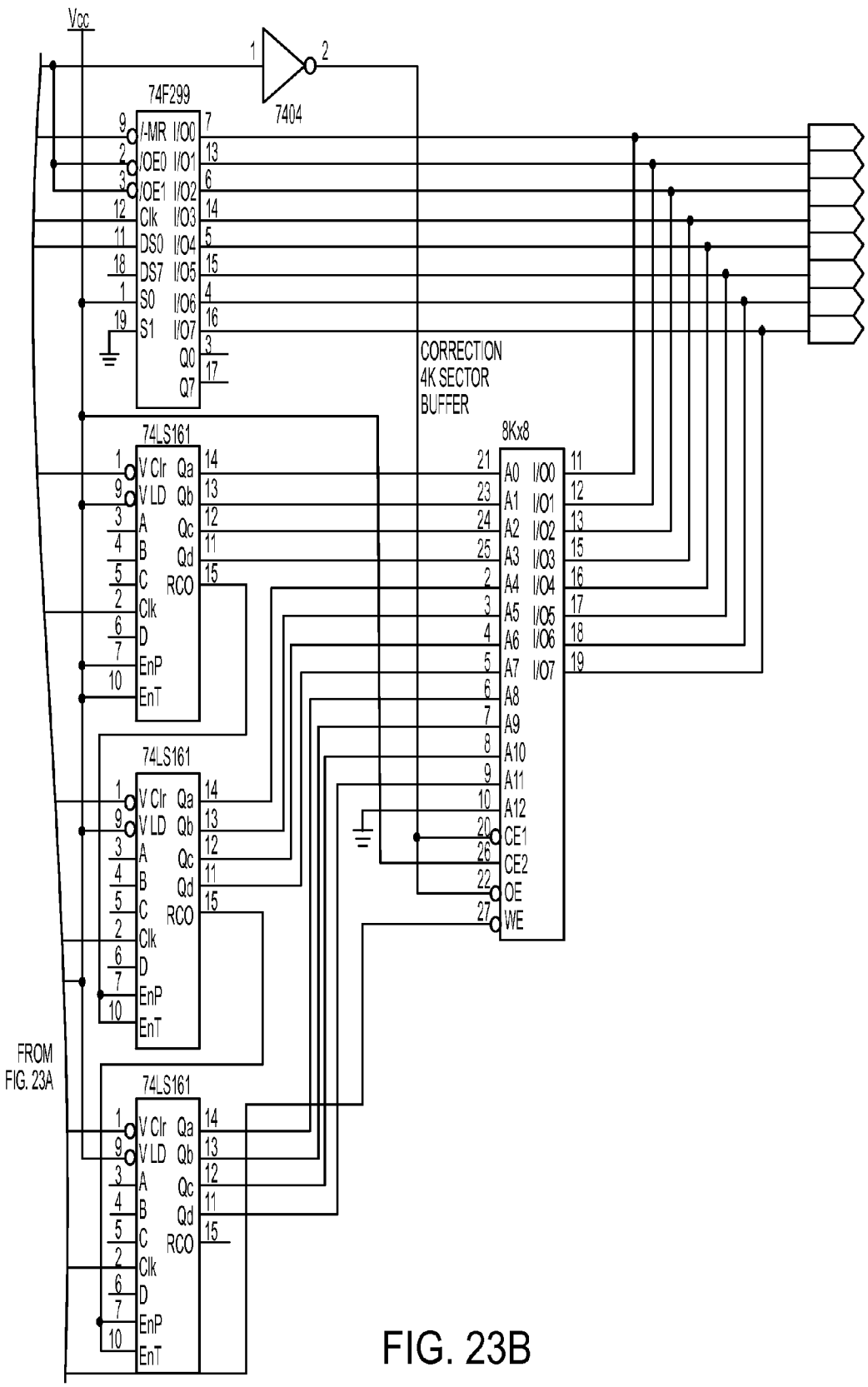

FIG. 21 illustrates circuitry to determine if there should be a bit-stream-in-error flag for a particular bit stream. In a typical embodiment, there are nine of these circuits. For illustrative purposes, only a single circuit is shown. However, this circuit can be duplicated for purposes of the other eight circuits.

FIGS. 22A-23B illustrate circuitry for buffering corrected error bit streams prior to routing them either back to an originating device, or to a selected backup device.

Figure 24A:
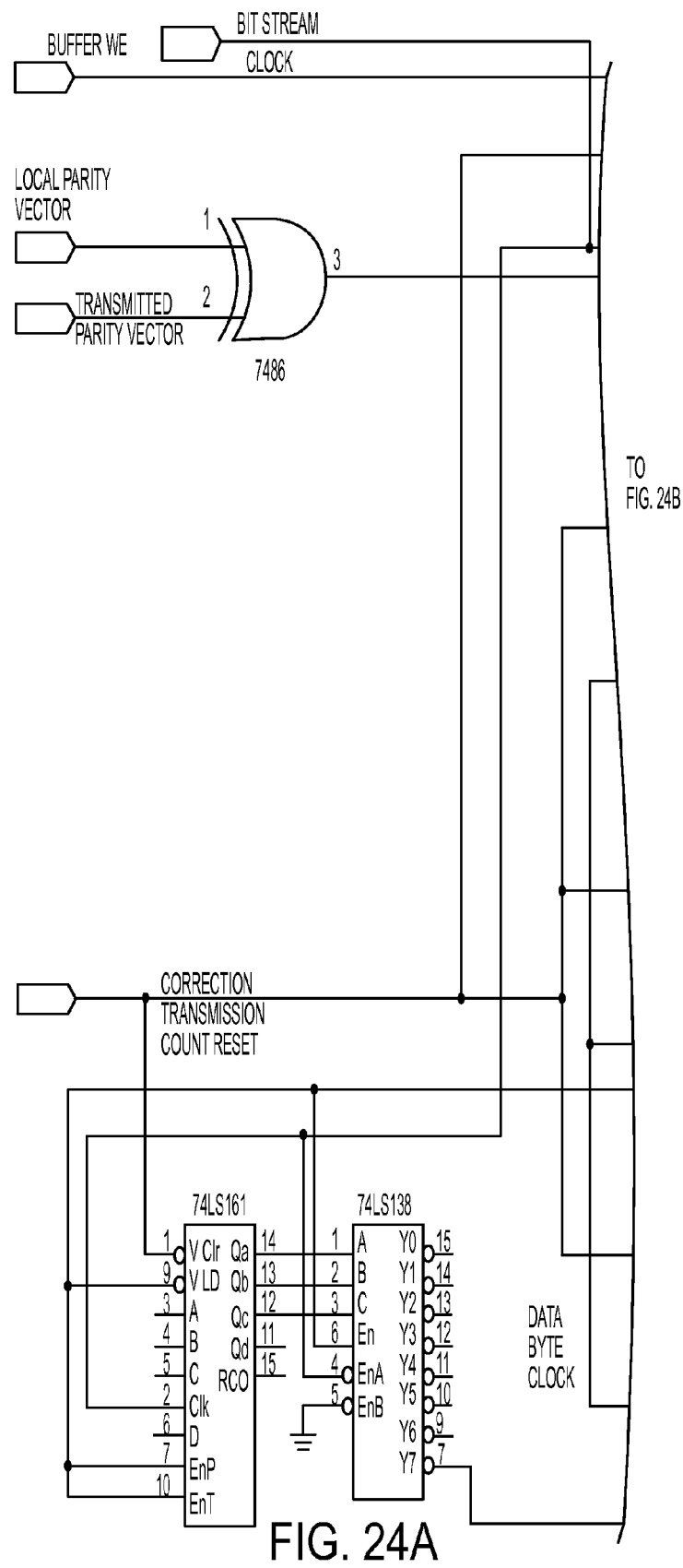
Figure 24B:
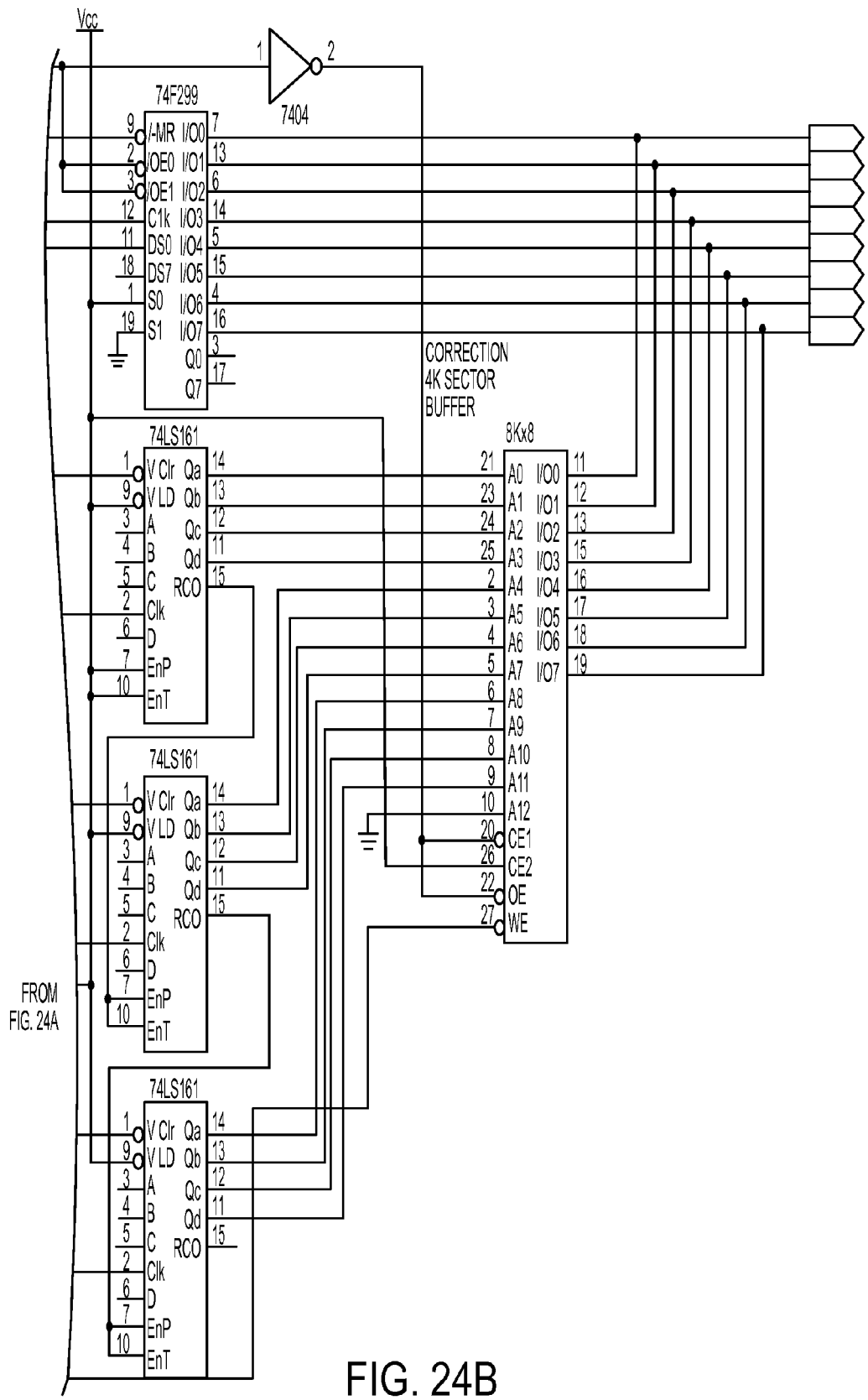

FIGS. 24A-24B illustrate circuitry for correcting a parity bit stream (i.e., transmitted parity vector) when the parity bit stream contains an error.

Although various embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

What is claimed is:

1. A method of storing data using a computer system, the method comprising, on the computer system:
   receiving data;
   splitting the data into a plurality of fixed-size blocks, each block comprising a plurality of bytes;
   for each block of the plurality of fixed-size blocks:
      calculating an error-correction byte;
      appending the error-correction byte to the block as one of the plurality of bytes;
      calculating, as part of the block, a parity bit for each of the plurality of bytes;
      separating the block into a plurality of bit streams that are perpendicular to the plurality of bytes, each bit position of the block corresponding to one of the plurality of bit streams; and
      causing the plurality of bit streams to be stored on a plurality of storage elements in a bit-striped fashion.

2. The method of claim 1, comprising:
   accessing at least one block of the plurality of fixed-size blocks;
   computing an error pattern based on the error-correction byte of the at least one block;
   detecting one or more correctable errors in the block; and
   correcting the one or more correctable errors.

3. The method of claim 2, wherein:

$g(x) = x^8 + x^5 + x^4 + x^3 + x^0$;

$a_7 = (a_6 x^6 + a_5 x^5 + a_4 x^4 + a_3 x^3 + a_2 x^2 + a_1 x^1 + a_0 x^0) \text{modulo } g(x) = 0$;

the received data is represented by:

$a_7 x^7 + a_6 x^6 + a_5 x^5 + a_4 x^4 + a_3 x^3 + a_2 x^2 + a_1 x^1 + a_0 x^0$; and $a_7$ comprises the error-correction byte.

4. The method of claim 3, wherein:

$f(x) = a_7 x^7 + a_6 x^6 + a_5 x^5 + a_4 x^4 + a_3 x^3 + a_2 x^2 + a_1 x^1 + a_0 x^0$;

$$EP = \frac{f(x)}{g(x)};$$

f(x) comprises at least a portion of the at least one block; and
   EP comprises the error pattern.

5. The method of claim 4, wherein:
   the detecting comprises detecting:
      a non-zero value for the error pattern; and
      an error flag for each of a bit-stream-in-error X and a bit-stream-in-error Y; and
   the correcting comprises:
      computing a first error-correction vector for the bit-stream-in-error X;
      computing a second error-correction vector for the bit-stream-in-error Y;
      correcting the bit-stream-in-error X, the correcting comprising adding the first error-correction vector to the bit-stream-in-error X; and
      correcting the bit-stream-in-error Y, the correcting comprising adding the second error-correction vector to the bit-stream-in-error Y.

6. The method of claim 5, wherein:

$\mathbb{K}2 = [\mathbb{I} + (\mathbb{S}(X) * \mathbb{S}(Y))]^{-1}$;

$\mathbb{K}3 = \mathbb{S}(Y) * K2$;

$\mathbb{S}(X)$ is a syndrome matrix unique to a bit position of the bit-stream-in-error X; and
   $\mathbb{S}(Y)$ is a syndrome matrix unique to a bit position of the bit-stream-in-error Y;
   $E(X) = [P * \mathbb{K}2] + [EP * \mathbb{K}3]$;
   $E(Y) = P + E(X)$;
   P is a local parity vector for the at least one block;
   E(X) is the first error-correction vector; and
   E(Y) is the second error-correction vector.

7. The method of claim 6, wherein at least one of $\mathbb{K}2$ and $\mathbb{K}3$ are pre-computed and retrieved from a lookup table.

8. The method of claim 7, wherein the computing of the first error-correction vector comprises:
   accessing a first lookup table via a first index, the first index comprising a lowest ordinal-numbered bit stream between the bit-stream-in-error X and the bit-stream-in-error Y and a bit-stream difference between the bit-stream-in-error X and the bit-stream-in-error Y;
   retrieving $\mathbb{K}2$ from the first lookup table; and
   accessing a second lookup table via a second index, the second index comprising a highest ordinal-numbered bit stream between the first bit-stream-in-error X and the bit-stream-in-error Y and the bit-stream difference; and
   retrieving $\mathbb{K}3$ from the second lookup table.

9. The method of claim 4, wherein:
   the detecting comprises detecting:
      a non-zero value for the error pattern; and
      an error flag for a single bit-stream-in-error; and
   the correcting comprises:
      accessing a local parity vector for the at least one block;
      setting the local parity vector as an error-correction vector for the single bit-stream-in-error; and
      adding the error-correction vector to the single bit-stream-in-error.

10. The method of claim 4, wherein:
   the detecting comprises detecting:
      a non-zero value for the error pattern;
      no error flags; and
      that a local parity vector and a parity vector stored in the at least one block are different; and
   the correcting comprises:
      accessing the local parity vector and the error pattern;
      accessing linear feedback shift register (LFSR) shifted values relative to a bit-reversed form of the error pattern;
      comparing the LFSR-shifted values to the local parity vector;
      attempting to identify a single bit-stream-in-error based on the comparing;
      responsive to identifying a single bit-stream-in-error, setting the local parity vector as an error-correction vector for the single bit-stream-in-error; and
      adding the local parity vector to the single bit-stream-in-error.

11. The method of claim 10, wherein:
   the LFSR-shifted values comprise values for zero, one, two three, four, five, six, and seven shifts; and
   the LFSR-shifted values are computed via an LFSR that has been configured with g(x) as divisor.

12. The method of claim 11, wherein the accessing of the LFSR-shifted values comprises retrieving at least a portion of the LFSR-shifted values from at least one lookup table.

13. The method of claim 11, wherein the accessing of the LFSR-shifted values comprises accessing the values for one, two, three, four, five, six, and seven shifts from at least one of a plurality of lookup tables using the error pattern as an index.

14. The method of claim 10, wherein the attempting comprises identifying the single bit-stream-in-error responsive to one of the LFSR-shifted values matching the local parity vector.

15. The method of claim 4, wherein:
the detecting comprises detecting:
no error flags; and
that a local parity vector and a stored parity vector in the at least one block are different; and
the correcting comprises:
accessing the local parity vector; and
replacing the stored parity vector with the local parity vector.

16. The method of claim 2, comprising storing the at least one block as corrected.

17. The method of claim 2, comprising performing the correcting on at least one of storage, read, and transmission of the data.

18. The method of claim 1, wherein the causing comprises transmitting the plurality of bit streams in parallel to a storage interface controller.

19. The method of claim 1, wherein the plurality of storage elements comprise at least a portion of a Redundant Array of Independent Disks (RAID) storage system.

20. The method of claim 19, wherein the RAID storage system comprises a RAID 0 storage system.

21. A system comprising;
an error-correction module, the error-correction module comprising circuitry operable to:
receive data;
split the data into a plurality of fixed-size blocks, each block comprising a plurality of bytes;
for each block of the plurality of fixed-size blocks:
calculate an error-correction byte;
append the error-correction byte to the block as one of the plurality of bytes;
calculate, as part of the block, a parity bit for each of the plurality of bytes;
separate the block into a plurality of bit streams that are perpendicular to the plurality of bytes, each bit position of the block corresponding to one of the plurality of bit streams; and
a plurality of transmission buffers, the plurality of transmission buffers comprising circuitry operable to:
transmit the plurality of bit streams in parallel to a storage interface controller for storage on a plurality of storage elements in a bit-striped fashion.

* * * * *